United States Patent
Takahashi et al.

(10) Patent No.: US 8,270,138 B2
(45) Date of Patent: Sep. 18, 2012

(54) POWER SUPPLY CONTROLLER AND THRESHOLD ADJUSTMENT METHOD THEREOF

(75) Inventors: Seiji Takahashi, Yokkaichi (JP); Masayuki Kato, Yokkaichi (JP); Masahiko Furuichi, Yokkaichi (JP)

(73) Assignees: Autonetworks Technologies, Limited, Mie (JP); Sumitomo Wiring Systems, Limited, Mie (JP); Sumitomo Electric Industries, Limited, Osaka (JP)

( * ) Notice: Subject to any disclaimer, the term of this patent is extended or adjusted under 35 U.S.C. 154(b) by 714 days.

(21) Appl. No.: 12/086,639

(22) PCT Filed: Dec. 26, 2006

(86) PCT No.: PCT/JP2006/325927
§ 371 (c)(1),
(2), (4) Date: Jun. 17, 2008

(87) PCT Pub. No.: WO2007/074828
PCT Pub. Date: Jul. 5, 2007

(65) Prior Publication Data
US 2009/0116161 A1 May 7, 2009

(30) Foreign Application Priority Data

Dec. 26, 2005 (JP) ................................. 2005-371998
Jan. 20, 2006 (JP) ................................. 2006-013175
Jul. 11, 2006 (JP) ................................. 2006-190707

(51) Int. Cl.
*H20H 3/00* (2006.01)
*H20H 9/02* (2006.01)

(52) U.S. Cl. ......... 361/101; 361/93.4; 361/93.7; 361/94
(58) Field of Classification Search ................. 361/93.7, 361/94, 101, 93.4
See application file for complete search history.

(56) References Cited

U.S. PATENT DOCUMENTS 5,172,291 A * 12/1992 Bakely et al. ................... 361/85
5,375,029 A * 12/1994 Fukunaga et al. ............ 361/101
5,856,711 A * 1/1999 Kato et al. .................... 307/10.6
(Continued)

FOREIGN PATENT DOCUMENTS

DE 102 45 098 A1 4/2003
(Continued)

OTHER PUBLICATIONS

Feb. 23, 2010 Office Action issued in Japanese Patent Application No. 2007-522739 (with translation).

*Primary Examiner* — Rexford Barnie
*Assistant Examiner* — Zeev V Kitov
(74) *Attorney, Agent, or Firm* — Oliff & Berridge, PLC

(57) ABSTRACT

An inrush current higher than a second anomaly threshold current ILfc passes through a power MOSFET 14, when a control signal S1 of low level is applied to a gate driver 28 so that the power MOSFET 14 and the like turn to a conductive state. A first forcing shutoff operation for the power MOSFET 14 is then prevented, because a first anomaly threshold current ILoc is set to an initial level higher than the inrush current. A fuse time counter 73 starts a count-up operation in response to the occurrence of the inrush current, and continues to increment its count value until a load current IL falls below the second anomaly threshold current ILfc. According to the count value, the first anomaly threshold current ILoc is decreased stepwise with time.

21 Claims, 21 Drawing Sheets

U.S. PATENT DOCUMENTS

| | | | |
|---|---|---|---|
| 5,866,957 A * | 2/1999 | Baba et al. | 307/113 |
| 5,943,203 A * | 8/1999 | Wang | 361/75 |
| 6,411,483 B1 * | 6/2002 | Sarles et al. | 361/93.4 |
| 7,079,368 B2 * | 7/2006 | Ishikawa et al. | 361/93.1 |
| 7,298,099 B2 * | 11/2007 | Ribarich | 315/308 |
| 2003/0072120 A1 | 4/2003 | Ishikawa et al. | |

FOREIGN PATENT DOCUMENTS

| | | |
|---|---|---|
| EP | 1 393 443 B1 | 7/2005 |
| JP | A-2001-217696 | 8/2001 |
| JP | A-2003-111264 | 4/2003 |
| JP | A-2003-283314 | 10/2003 |

* cited by examiner

FIG.7

| COUNT VALUE | bit0 | bit1 | bit2 | bit3 | bit4 | bit5 |
|---|---|---|---|---|---|---|
| $0 \leq m < 8$ | Lo | Hi | Hi | Hi | Hi | Hi |
| $8 \leq m < 16$ | Hi | Lo | Hi | Hi | Hi | Hi |
| $16 \leq m < 32$ | Hi | Hi | Lo | Hi | Hi | Hi |
| $32 \leq m < 64$ | Hi | Hi | Hi | Lo | Hi | Hi |
| $64 \leq m < 128$ | Hi | Hi | Hi | Hi | Lo | Hi |
| $128 \leq m$ | Hi | Hi | Hi | Hi | Hi | Lo |

FIG.17

| FC COUNTER | FR COUNTER (higher 5 bits) | THRESHOLD DESIGNATION SIGNAL |
|---|---|---|
| [FCC]<8 | 0≤[FRC]<1 | OCL0 |
| | 1≤[FRC]<2 | OCL1 |
| | 2≤[FRC]<4 | OCL2 |
| | 4≤[FRC]<8 | OCL3 |
| | 8≤[FRC]<32 | OCL4 |
| | [FRC]≤32 | OCL5 |
| [FCC]≥8 | — | OCL5 | ial

POWER SUPPLY CONTROLLER AND THRESHOLD ADJUSTMENT METHOD THEREOF

TECHNICAL FIELD

The present invention relates to a power supply controller, and particularly relates to a measure against an inrush current.

BACKGROUND ART

A power supply controller is conventionally provided, in which a high-power semiconductor switching element such as a power MOSFET is disposed on a power supply line connected between a power source and a load, and which is configured to control the power supply to the load by switching the semiconductor switching element between ON and OFF. Some of such power supply controllers have a self-protective function. The self-protective function turns off the semiconductor switching element in response to an occurrence of overcurrent by controlling the potential of the control terminal of the semiconductor switching element, so as to protect the semiconductor switching element. Specifically, a current detecting resistor is serially connected to a current conducting terminal (e.g., the source or drain in the case of a MOSFET) of the semiconductor switching element, as shown in JP-A-2001-217696, for example. A load current passing through the semiconductor switching element is detected based on the voltage drop on the resistor, and the occurrence of overcurrent is determined if the load current is higher than a predetermined threshold. If the current is shut off due to the above-described self-protective function, the switching element is automatically restored to an ON state when a predetermined time has elapsed since the shutoff. This is because the function is provided to prevent the semiconductor switching element from overheating and, when the abnormal current is shut off, the temperature of the semiconductor switching element should be immediately lowered by a heat radiator conventionally provided therein.

In the case that the load is a motor or a lamp, for example, an inrush current, i.e., a current much higher than the rated current of the load, may pass through the semiconductor switching element for a short time when the power supply controller is powered on. If the above threshold for determining the overcurrent is set to a lower level than the inrush current, for example, the semiconductor switching element will repeat a shutoff/recovery operation, i.e., shutoff due to the inrush current and return to an ON state a predetermined time after that, until the inrush current has died down after the power-on. Then the problem arises that the control is slow to progress to the power supply for the load.

If the threshold is set to a higher level than the inrush current to avoid this problem, another problem arises that an overcurrent can be determined only if higher than the inrush current, when the overcurrent due to short-circuiting in the load, for example, passes through the semiconductor switching element after a steady state is reached.

Thus, there is a need in the art to detect an overcurrent anomaly early while implementing a measure against an inrush current.

SUMMARY OF THE INVENTION

A threshold adjustment method for a power supply controller according to the present invention is provided for a power supply controller that has an overcurrent protective function for performing a first shutoff operation for a semiconductor switching element, disposed on a power supply line from a power source to a load, for a first reference time if a load current passing through the semiconductor switching element exceeds a first threshold, and thereafter restoring the semiconductor switching element to a conductive state. The threshold adjustment method for the power supply controller includes decreasing a level of the first threshold with time if current supply on the power supply line is started.

According to this construction, the first threshold used for a first shutoff operation for the semiconductor switching element can be set to a relatively high level as an initial level unless and until current supply is detected on the power supply line. The first threshold is changed to a level lower than the initial level if current supply is detected on the power supply line. The initial level of the first threshold can be set to a level higher than an inrush current, and thereby, while preventing a first shutoff operation due to the inrush current from being performed for the semiconductor switching element, an overcurrent lower than the inrush current can be detected as an anomaly after a steady state is reached, so that a first shutoff operation is performed for the semiconductor switching element.

The above invention preferably includes performing an initialization operation, for restoring the first threshold to the initial level if the first shutoff operation is performed for the semiconductor switching element due to the overcurrent protective function being performed, at most a predetermined number of times.

In the case of a construction wherein the first threshold is maintained to a low level even if the first shutoff operation is performed for the semiconductor switching element after current supply is detected on the power supply line, a problem may arise as follows. If the load resistance during the start-up of the load is high for some reasons resulting in an inrush current changing more gradually than assumed in the design phase, for example, the first shutoff operation may be performed for the semiconductor switching element due to the level of the inrush current exceeding the first threshold which has been decreased. The semiconductor switching element is restored to the conductive state when a first reference time has elapsed, and then an inrush current occurs. The level of the inrush current may immediately exceed the first threshold that has been changed to a low level already, and thereby the first shutoff operation is performed for the semiconductor switching element again. Thus current supply for the semiconductor switching element and immediate shutoff due to an inrush current may be repeated, so that normal control for power supply to the load cannot be started.

According to the present invention, the initialization operation, for restoring the first threshold to the initial level if the first shutoff operation for the semiconductor switching element is performed after a current supply detection signal is outputted, is performed at most a predetermined number of times. Therefore current supply for the semiconductor switching element until an inrush current exceeds the temporally changing first threshold, and shutoff when the inrush current exceeds the first threshold can be repeated. Thereby the level of the inrush current rise gradually decreases, resulting in falling below the first threshold. Then the repetition of current supply and immediate shutoff for the semiconductor switching element terminates. On the other hand, after the initialization operation has been performed the predetermined number of times, the first threshold is maintained to the low level without being initialized, so that an overcurrent anomaly can be detected based on the low level.

Preferably, in the present invention, the current supply detecting circuit is a second abnormal current detecting circuit configured to determine based on a current detection signal from the current detecting element whether or not a load current passing through the semiconductor switching element exceeds a second threshold lower than the first threshold, and further configured to output a second abnormal current signal if the load current exceeds the second threshold. The power supply controller further includes an anomaly time accumulator circuit configured to start an operation for accumulating an anomaly time during which at least a second abnormal current signal is outputted, if the second abnormal current signal is outputted from the second abnormal current detecting circuit. The threshold adjustment circuit is configured to decrease a level of the first threshold according to an accumulated time of the anomaly time accumulator circuit.

According to this construction, the first threshold used for a shutoff operation for the semiconductor switching element can be set to a relatively high level as an initial level unless and until the load current passing through the semiconductor switching element exceeds the second threshold. The first threshold is changed to a level lower than the initial level according to an accumulated time that is obtained by accumulation started if the load current exceeds the second threshold. The initial level of the first threshold can be set to a level higher than an inrush current, and thereby, while preventing a shutoff operation due to the inrush current from being performed for the semiconductor switching element, an overcurrent lower than the inrush current can be detected as an anomaly after a steady state is reached, so that a shutoff operation is performed for the semiconductor switching element.

In some power supply controllers, another switching element on the power supply line is provided on the downstream side of the semiconductor switching element, for example, so that power supply to the load can be also controlled by ON-OFF switching of the switching element. In this case, an inrush current may occur on the power supply line repeatedly, if ON-OFF switching of the downstream-side switching element is repeated, for example. That is, an inrush current may occur when the switching element is restored from a shutoff state to a conductive state after power-on, as well as when the power supply controller is powered on.

Therefore, in the present invention, the first threshold is preferably restored to the initial level or the like by clearing an accumulated time of the anomaly time accumulator circuit (i.e., by changing the present accumulated time to the initial time or to a time closer to the initial time), if a state in which the load current is maintained equal to or lower than a normal level continues for a second reference time after the accumulation of the anomaly time is started. Thereby, a shutoff operation due to an inrush current is prevented from being repeatedly performed for the semiconductor switching element, if the inrush current repeatedly occurs after the power supply controller is powered on.

Further preferably, in the present invention, accumulation of an anomaly time is started when the load current on the power supply line exceeds the second threshold, and a shutoff operation is performed for the semiconductor switching element when the anomaly time reaches a third reference time. On the other hand, if a normal state, in which the load current is equal to or lower than the normal level, continues for a second reference time without the third reference time being reached, an accumulated time of the anomaly time accumulator circuit having been accumulated is cleared (i.e., the present accumulated time is restored to the initial value or to a value closer to the initial value) so that a shutoff operation for the semiconductor switching element is prevented. Thereby, as well as a continuous overcurrent, a chattering short, i.e., an intermittent overcurrent that occurs at intervals shorter than the second reference time, can be detected, so that protection of an external circuit (including a load and an electric wire) can be achieved.

In the case that another switching element on the power supply line is provided on the downstream side of the semiconductor switching element of the power supply controller, for example, so that power supply to the load can be also controlled by ON-OFF switching of the downstream-side switching element while maintaining the semiconductor switching element of the power supply controller ON, an inrush current may occur on the power supply line repeatedly if ON-OFF switching of the downstream-side switching element is repeated.

Therefore preferably, in the present invention, if a state, in which the load current is equal to or lower than the normal level, continues for a second reference time after accumulation of the anomaly time is started, the first threshold is restored to the initial level or the like by resetting an accumulated time of the anomaly time accumulator circuit to the initial time, and the count number is reset so that the initialization operation is enabled. Thereby, if the inrush current repeatedly occurs after the power supply controller is powered on, repetition of current supply and immediate shutoff for the semiconductor switching element due to the repetition of the inrush current can be terminated.

BRIEF DESCRIPTION OF THE DRAWINGS

FIG. 7 is a table showing the correspondence relation between the count value and bit signals of a fuse time counter;

FIG. 17 is a table showing the correspondence relation between the count values, of a fuse counter and an FR counter, and a threshold designation signal;

BEST MODE FOR CARRYING OUT THE INVENTION

An embodiment according to the present invention will be explained with reference to FIGS. 1 through 13.
<Construction of Power Supply Controller>

Figure 1:
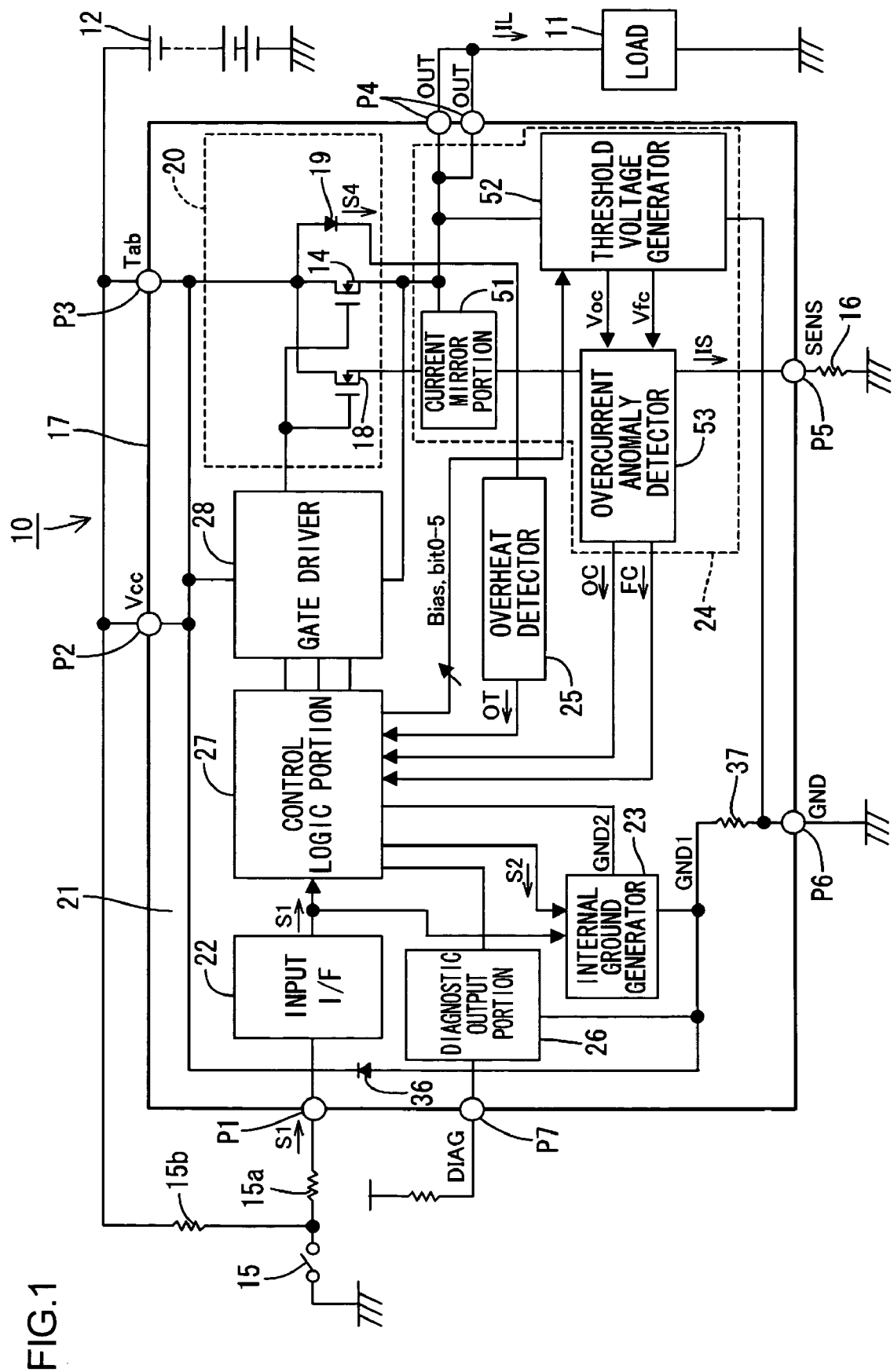
FIG. 1 is a block diagram showing the general construction of a power supply controller according to a first embodiment of the present invention.

FIG. 1 is a block diagram showing the general construction of a power supply controller 10 according to the present embodiment. The power supply controller 10 can be installed on a vehicle not shown, and used for control of the power supply from a vehicle power source (hereinafter, referred to as "a power source 12") to a load 11 such as a defogger heater (i.e., a linear resistive load), a vehicle lamp, or a motor for a cooling fan or a wiper (i.e., an L-load (or inductive load)). Hereinafter, "a load" means a device to be controlled by the power supply controller 10, and does not include an electric wire 30 connected between the power supply controller 10 and the controlled device. The load 11 and the electric wire 30 are collectively called "an external circuit" in the following explanation.

Specifically, the power supply controller 10 includes a power MOSFET 14 (i.e., an example of "a semiconductor switching element") as a power FET disposed on a power supply line 13 connected between the power source 12 and the load 11. In the power supply controller 10, a control signal S1 such as a constant voltage signal or a PWM (Pulse Width Modulation) control signal is applied to the gate of the power MOSFET 14 so as to switch the power MOSFET between ON and OFF. Thereby power supply to the load 11 connected to the output side of the power MOSFET 14 is controlled. In the present embodiment, an input terminal P1 of the power supply controller 10 is connected to an external operation switch 15, and the power supply controller operates when the operation switch 15 is ON. Specifically the input terminal P1 is connected to the operation switch 15 via a resistor 15a, and the connecting point between the operation switch 15 and the resistor 15a is connected to the power source 12 via a resistor 15b. Thus the input terminal P1 is pulled up to the power supply voltage Vcc side when the operation switch 15 is OFF.

As shown in FIG. 1, the power supply controller 10 is formed as a semiconductor device 17 (semiconducting device), on which the input terminal P1, a power supply (Vcc) terminal P2 and a tab terminal P3 to be connected to the power source 12, a load connecting terminal P4 to be connected to the load 11, an external terminal P5 to be connected to the ground (GND) via an external resistor 16 as a current-voltage converter circuit, a ground terminal P6 to be connected directly to the ground (GND), and a diagnostic output terminal P7 are provided. In the present embodiment, the power MOSFET 14, a sense MOSFET 18 (i.e., an example of "a current detecting element") as a sense FET described below and a temperature sensor 19 (e.g., a diode in the present embodiment) as a temperature detecting element are configured onto a single chip as a power chip 20, which is mounted on a control chip 21 that includes the other circuits.

A plurality of MOSFETs are arranged on the power chip 20. The drains of the MOSFETs are connected in common to one another, and further connected to the tab terminal P3. The sources of most of the MOSFETs are connected in common to a power FET input 51a of a current mirror portion 51 described below and the load connecting terminal P4, so that the MOSFETs form the power MOSFET 14. The sources of the rest of the MOSFETs are connected in common to a sense FET input 51b of the current mirror portion 51, so that the MOSFETs form the sense MOSFET 18. The ratio of the number of MOSFETs constituting the sense MOSFET 18 to the number of MOSFETs constituting the power MOSFET 14 corresponds approximately to a sense ratio.

The control chip 21 mainly includes an input interface 22, an internal ground generator 23, a current detector 24, an overheat detector 25, a diagnostic output portion 26, a control logic portion 27 functioning as an overcurrent protective circuit and as an overheat protective circuit, and a gate driver 28.
(Input Interface)

The input side of the input interface 22 is connected to the input terminal P1. Thereby a control signal S1 of high level is inputted when the operation switch 15 is OFF, while a control signal S1 of low level is inputted when the operation switch is ON. The control signal S1 is then applied to the internal ground generator 23 and the control logic portion 27. In a normal state, i.e., when neither a current anomaly nor a temperature anomaly has occurred as will be described below, the power supply controller 10 turns ON the power MOSFET 14, resulting in a conductive state, by the gate driver 28 in response to a low-level control signal S1 described above. On the other hand, in response to a high-level control signal S1, the power supply controller 10 turns OFF the power MOSFET 14 by the gate driver 28, resulting in a shutoff state. A low-level control signal S1 of the present embodiment is an example of "an ON signal". A high-level control signal S1 is an example of "an OFF signal". The gate driver 28 functions as "a switch control circuit".

Figure 2:
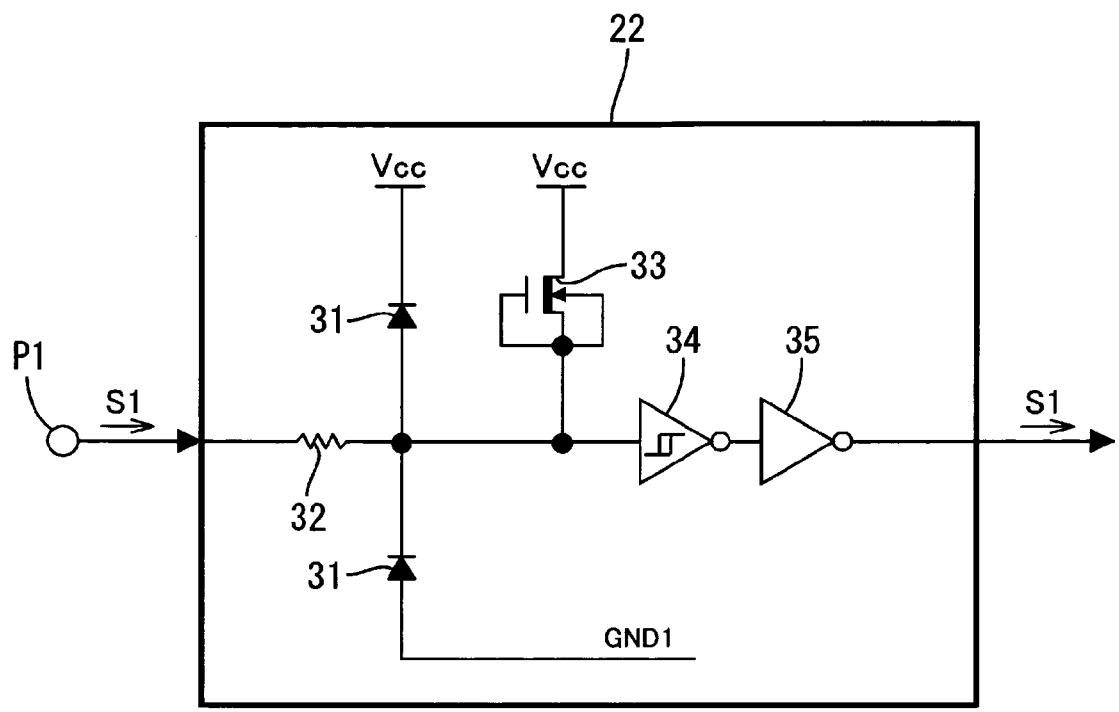
FIG. 2 is a circuit diagram of an input interface.

Specifically, as shown in FIG. 2, the input interface 22 includes a pair of diodes 31 and 31 serially connected between the power supply terminal P2 and an internal ground GND1 (0<GND1<Vcc), and the cathode sides thereof are connected to the higher potential side. To the connecting point therebetween, the input terminal P1 is connected via a resistor 32. An FET 33, in which short connection between the source and gate (i.e., diode connection) is formed, is connected in parallel to the diode 31 on the higher potential side. When a control signal S1 of high level is inputted to the input terminal P1, it is pulled up to the power supply voltage Vcc side so that a high-level signal (referred to as a high-level control signal S1 for simplifying explanation in the present embodiment) corresponding to the high-level control signal S1 is outputted via a hysteresis comparator 34 and an inverting circuit 35. On the other hand, when a control signal S1 of low level is inputted to the input terminal P1, a constant current from the FET 33 passes to the input terminal P1 side via the resistor 32 so that a low-level signal (referred to as a low-level control signal S1 for simplifying explanation in the present embodiment) corresponding to the low-level control signal S1 is outputted via the hysteresis comparator 34 and the inverting circuit 35.

When a control signal S1 of negative voltage (lower than GND1) is inputted to the input terminal P1, a current passes from the internal ground GND1 to the input terminal P1 side via the lower-potential-side diode 31 and the resistor 32 so that a low-level control signal S1 is also outputted. A diode 36, the cathode side of which is connected to the higher potential side, and a resistor 37 are serially connected between the power supply terminal P2 and the ground terminal P6 as shown in FIG. 1. The connecting point therebetween is provided as the above internal ground GND1. According to this construction, if the ground terminal P6 side is connected to the power supply voltage Vcc side by mistake, a current passing into the circuits of the power supply controller 10 is suppressed because of the diode 36 so as to be equal to or lower than a predetermined level.

(Internal Ground Generator)

The internal ground generator 23 as a constant supply-voltage generator operates when it receives a low-level control signal S1 (ON signal) from the input interface 22 or a low-level output signal S2 (indicating that a clear counter 72 has not overflowed) from the clear counter 72 described below, so as to generate an internal ground GND2 lower than the power supply voltage Vcc by a predetermined constant voltage. That is, the internal ground generator 23 is maintained to the operational state so as to continue generation of the internal ground GND2 as long as a low-level output signal S2 is received from the clear counter 72, even if a high-level control signal S1 (OFF signal) is received from the input interface 22. Thus the constant voltage, corresponding to the difference determined by subtracting the internal ground GND2 from the power supply voltage Vcc, is provided for the control logic portion 27, and thereby the control logic portion 27 can operate.

Figure 3:
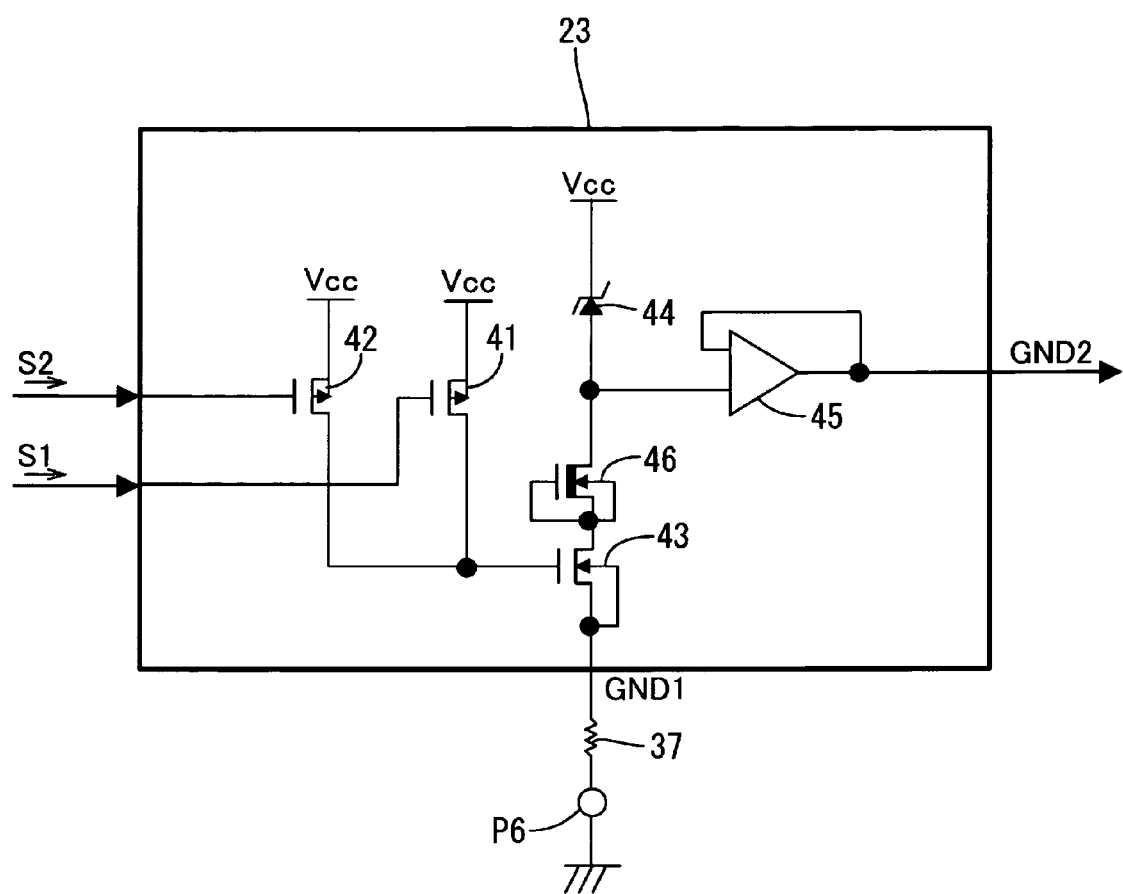
FIG. 3 is a circuit diagram of an internal ground generator.

Specifically, as shown in FIG. 3, the internal ground generator 23 includes an FET 41 as a switching element to be turned on in response to a low-level control signal S1 (ON signal), and an FET 42 as a switching element to be turned on in response to a low-level output signal S2. The output sides of the FETs 41, 42 are both connected to the control terminal of an FET 43 as a switching element. The input side (i.e., the drain side) of the FET 43 is connected to the power supply terminal P2 via a Zener Diode 44, while the output side (i.e., the source side) thereof is connected to the ground terminal P6 via the above resistor 37.

In the internal ground generator 23, the FET 43 is turned on in response to a low-level control signal S1 or a low-level output signal S2 described above. Thereby the internal ground generator operates so as to generate the internal ground GND2, which is lower than the power supply voltage Vcc by a voltage corresponding to the Zener voltage of the Zener diode 44. The generated internal ground is provided for the control logic portion 27, via an operational amplifier 45 as a voltage follower. In the present embodiment, an FET 46, in which short connection between the source and gate (i.e., diode connection) is formed, is disposed on a power supply line connected between the Zener diode 44 and the FET 43. Thereby a constant current passes through the Zener diode 44 when the FET 43 is on, and consequently a more stable internal ground GND2 can be generated.

(Current Detector)

Figure 4:
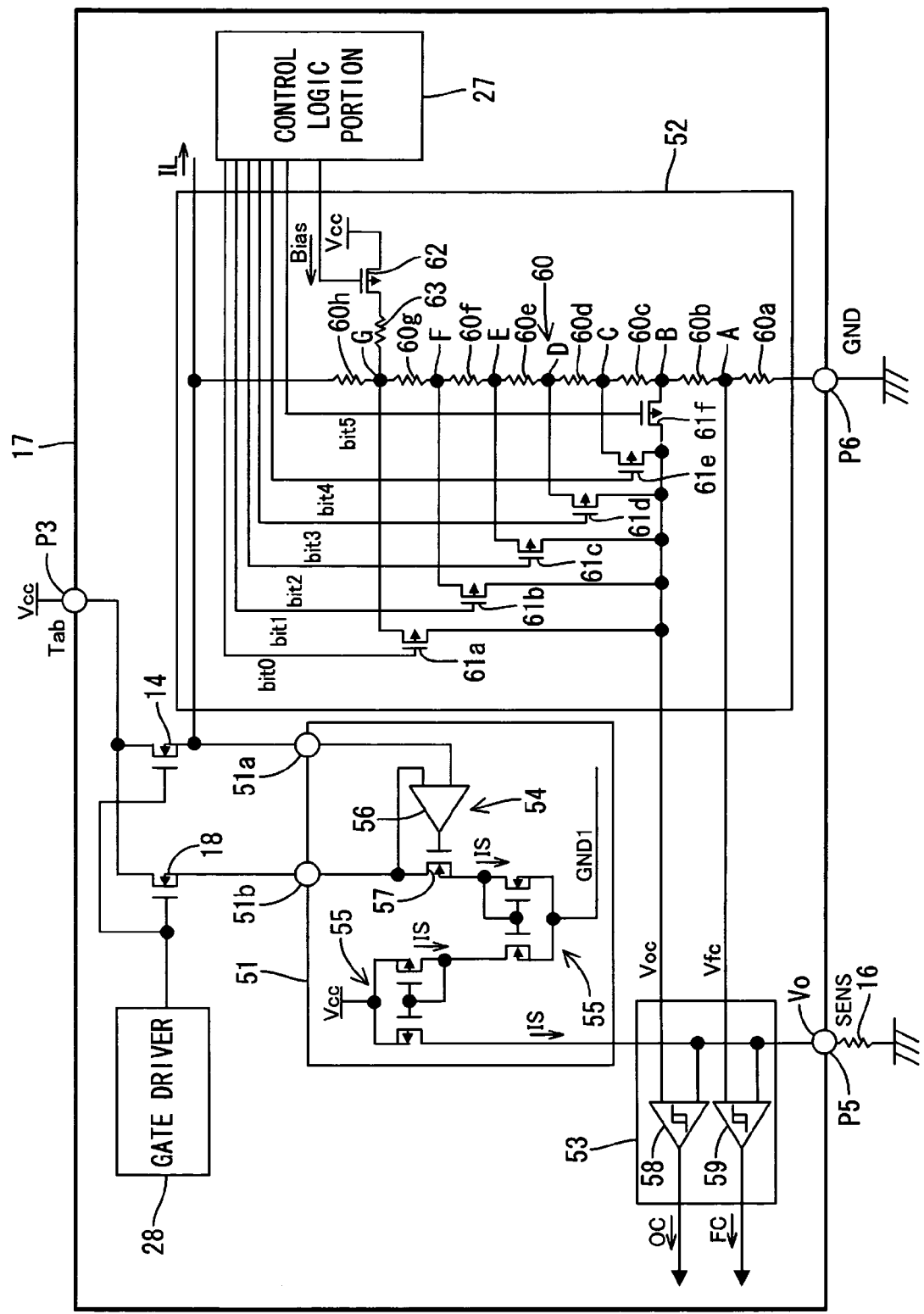
FIG. 4 is a circuit diagram of a current mirror portion, a threshold voltage generator and an overcurrent anomaly detector.

The current detector 24 includes a current mirror portion 51, a threshold voltage generator 52, and an overcurrent anomaly detector 53 as shown in FIG. 1. FIG. 4 magnifies and shows the circuits of the current mirror portion 51, the threshold voltage generator 52 and the overcurrent anomaly detector 53, and the rest of the circuit construction is partly omitted.

a. Current Mirror Portion

The current mirror portion 51 includes a potential controller 54 for maintaining the output-side potentials (i.e., the source potentials) of the power MOSFET 14 and the sense MOSFET 18 to be equal to each other, and further includes a pair of current mirror circuits 55 and 55.

The potential controller 54 includes an operational amplifier 56 and an FET 57 as a switching element. The pair of input terminals of the operational amplifier are connected to the power FET input 51a (i.e., to the source of the power MOSFET 14) and the sense FET input 51b (i.e., to the source of the sense MOSFET 18), respectively. The FET 57 is connected between the sense FET input 51b and the external terminal P5, and the output of the operational amplifier 56 is applied to the control terminal thereof. More specifically, the negative input of the operational amplifier 56 is connected to the power FET input 51a, while the positive input of the operational amplifier 56 is connected to the sense FET input 51b. The differential output of the operational amplifier 56 is fed back to the positive input through between the gate and drain of the FET 57.

The operational amplifier 56 is maintained in an imaginary short state due to the feedback of the differential output of the operational amplifier 56, that is, the potentials of the positive input and negative input are maintained almost equal to each other. Thereby the potentials of the drains of the power MOSFET 14 and the sense MOSFET 18 are maintained equal to each other, and the potentials of the sources thereof are also maintained equal to each other. Consequently, a sense current Is (i.e., an example of "a current detection signal from a current detecting element") passing through the sense MOSFET 18 can be stably maintained to a constant ratio (i.e., the above sense ratio) to a load current IL passing through the power MOSFET 14.

The sense current Is from the potential controller 54 passes into the external resistor 16 via the pair of current mirror circuits 55, 55 and the external terminal P5, and therefore the terminal voltage Vo of the external terminal P5 varies with the sense current Is.

b. Overcurrent Anomaly Detector

The overcurrent anomaly detector 53 includes a plurality (e.g., two in the present embodiment) of comparators 58, 59 (e.g., hysteresis comparators in the present embodiment). The terminal voltage Vo of the external terminal P5 is applied to one input of the comparator 58 and one input of the comparator 59.

The comparator 58 (i.e., an example of "a first abnormal current detecting circuit") receives a first anomaly threshold voltage Voc on the other input thereof from the threshold voltage generator 52, and outputs a first abnormal current signal OC of low level to the control logic portion 27 when the terminal voltage Vo exceeds the first anomaly threshold voltage Voc. Hereinafter, a load current IL, passing through the power MOSFET 14 when the terminal voltage Vo reaches the first anomaly threshold voltage Voc, i.e., during a current anomaly, is called "a first anomaly threshold current ILoc" (i.e., an example of "a first threshold"), and this current anomaly is called "an overcurrent".

The comparator 59 (i.e., an example of "a current supply detecting circuit" and "a second abnormal current detecting circuit") receives a second anomaly threshold voltage Vfc (<Voc) on the other input thereof from the threshold voltage generator 52, and outputs a second abnormal current signal FC of low level (i.e., an example of "a current supply detection signal") to the control logic portion 27 when the terminal voltage Vo exceeds the second anomaly threshold voltage Vfc. Hereinafter, a load current IL, passing through the power MOSFET 14 when the terminal voltage Vo reaches the second anomaly threshold voltage Vfc, i.e., during a current anomaly, is called "a second anomaly threshold current ILfc" (i.e., an example of "a second threshold"), and this current anomaly is called "a fuse current".

c. Threshold Voltage Generator

The threshold voltage generator 52 (i.e., an example of "a threshold adjustment circuit") includes a voltage-dividing circuit for dividing a reference voltage by a plurality of resistors. An anomaly threshold voltage applied to the overcurrent anomaly detector 53 can be adjusted by changing divided voltage(s) selected from a plurality of divided voltages generated by the voltage-dividing circuit. Specifically, as shown in FIG. 4, the threshold voltage generator 52 includes a voltage-dividing circuit 60 connected between the source of the power MOSFET 14 and the ground terminal P6. The voltage-dividing circuit 60 is formed by serially connecting a plurality of resistors (e.g., eight resistors 60a-60h in the present embodiment). The divided voltage at the connecting point A between the resistors 60a and 60b is outputted as the second anomaly threshold voltage Vfc.

The threshold voltage generator 52 further includes a plurality of FETs 61a-61f as switching elements for connecting the other input terminal of the comparator 58 selectively to the connecting points B-G between the resistors 60b-60h. Thereby the first anomaly threshold voltage Voc can be decreased stepwise by turning on the FETs 61a-61f selectively and sequentially. The ON-OFF control for the FETs 61a-61f is performed by the control logic portion 27 as described below.

In the present embodiment, the voltage-dividing circuit 60 is configured to divide the source voltage Vs of the power MOSFET 14, but may be configured to divide a predetermined voltage as a reference voltage other than the source voltage. According to the construction of the present embodiment, the anomaly threshold voltages can be set so as to vary with the source voltage Vs of the power MOSFET 14. Compared with a construction wherein the thresholds are set to fixed levels irrespective of variation of the source voltage, the terminal voltage Vo of the external resistor 16 immediately reaches the anomaly threshold voltage irrespective of the magnitude of the power supply voltage Vcc, when short-circuiting in the load 11 or the like has occurred, for example. Thereby the current anomaly can be detected rapidly. Moreover in the present embodiment, in order that the source voltage Vs is biased so as not to be 0[V] when the power MOSFET 14 is OFF, an FET 62, which is a switching element that turns on in response to a bias signal Bias from the control logic portion 27, is provided, through which a current from the power source 12 passes into the voltage-dividing circuit 60 via a resistor 63. The bias signal Bias is outputted from the control logic portion 27 for turning on the FET 62, when a control signal S1 of low level or an output signal S2 of low level is outputted.

Figure 5:
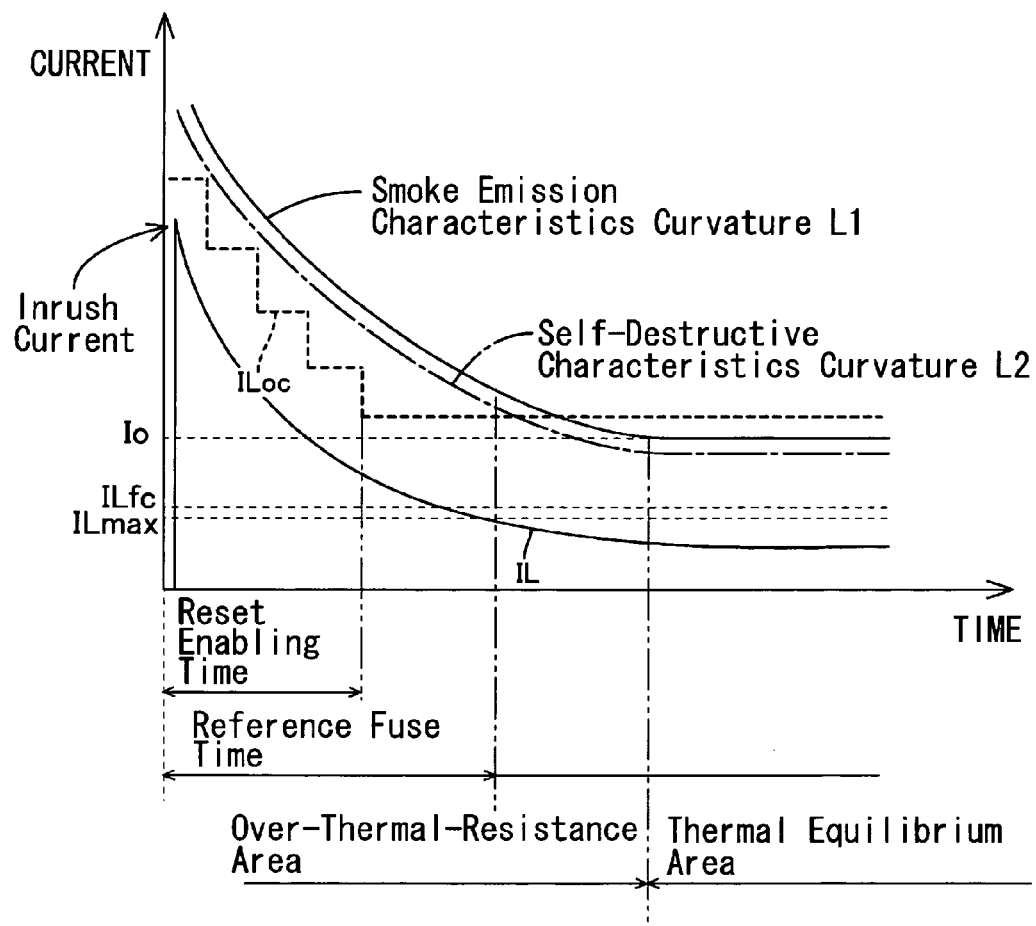
FIG. 5 is a graph for explanation of setup levels of a first anomaly threshold current and a second anomaly threshold current.

FIG. 5 is a graph for explanation of setup levels of the first anomaly threshold current ILoc and the second anomaly threshold current ILfc. The graph relates to the smoke emission characteristics of an electric wire 30 (e.g., a coating material of the electric wire) connectable to the power supply controller 10, in which the smoke emission characteristics curvature L1 representing the relation between a constant current level and a current-applying time (i.e., a time taken for fusing) is shown. That is, the smoke emission characteristics curvature L1 represents the relation between an arbitrary constant current (one-shot current) and a time taken for the coating material of the electric wire 30 to begin to burn while the constant current is applied to the electric wire 30. In the graph, a self-destructive characteristics curvature L2 is also shown, which represents the relation between an arbitrary constant current (one-shot current) and a time taken for the power MOSFET 14 to break while the constant current is applied to the MOSFET 14. The second anomaly threshold current ILfc is set to a value within the area where a current level is lower than the smoke emission characteristics curvature L1 and the self-destructive characteristics curvature L2. The first anomaly threshold current ILoc is set to a value within the area where a current level is lower than the smoke emission characteristics curvature L1 and the self-destructive characteristics curvature L2, for a time domain corresponding to a reference FUSE time described below beginning with start of count from the initial value by a fuse time counter 73 described below.

Note that the smoke emission characteristics shown in the graph relates to an electric wire 30 selected from electric wires 30 likely connected to the power supply controller 10. The smoke emission characteristics depends on an external circuit (e.g., a wiring member such as an electric wire, or a load) to be connected to the power supply controller 10. Therefore values of the load current IL and the sense current Is, based on which the above abnormal current signals FC, OC are outputted, should be also changed depending thereon. However, that can be readily achieved by adjusting the resistance of the above-described external resistor 64.

In the graph, ILmax represents the rated current of the load 11 (i.e., a limit of use against which the design thereof is guaranteed). Io represents the equilibrium critical current that can be applied while maintaining a thermal equilibrium state in which heat generation and radiation in the electric wire 30 are balanced. If a current of a higher level than the equilibrium critical current Io is applied, that relates to the over-thermal-resistance area in which a current level and a time taken for burn are substantially in inverse proportion to each other. The second anomaly threshold current ILfc is set to a value slightly higher than the rated current ILmax of the load 11 as shown in FIG. 5. The comparator 59 detects a fuse current when the load current IL reaches the second anomaly threshold current ILfc, and outputs a second abnormal current signal FC. If the load current IL is around the second anomaly threshold current ILfc, the power MOSFET 14 does not need to be turned OFF immediately. It should be turned OFF, only if the fuse current state continues for a considerable time as described below.

In contrast, the first anomaly threshold current ILoc is set to a level higher than the second anomaly threshold current ILfc. The comparator 58 detects an overcurrent when the load current IL reaches the first anomaly threshold current ILoc, and outputs a first abnormal current signal OC. When the load current IL is thus high level beyond the first anomaly threshold current ILoc, the power MOSFET 14 should be turned OFF immediately as described below. In preparation for an inrush current, the threshold voltage generator 52 first sets the first anomaly threshold current ILoc to an initial level higher than the inrush current as shown in FIG. 5. Thereafter, if a fuse current is detected as described below, the first anomaly threshold current is decreased stepwise with time.

(Overheat Detector)

The overheat detector 25 receives a temperature signal S4 corresponding to a temperature of the power chip 20 from the temperature sensor 19 provided on the power chip 20. The overheat detector 25 detects a temperature anomaly when the received temperature signal S4 exceeds a predetermined threshold temperature, and provides a low-level abnormal temperature signal OT to the control logic portion 27.

During a first or second forcing shutoff operation being performed for the power MOSFET 14 by the control logic portion 27 in response to an occurrence of a current anomaly or a temperature anomaly as described below, the diagnostic output portion 26 provides a diagnostic output by pulling down the diagnostic output terminal P7 to a low level in response to a high-level diagnostic signal Diag from the control logic portion 27. Thereby notification of the forcing shutoff state of the power MOSFET 14 due to the occurrence of a current anomaly or a temperature anomaly or due to the fuse function being performed can be provided to the outside.

(Control Logic Portion)

Figure 6:
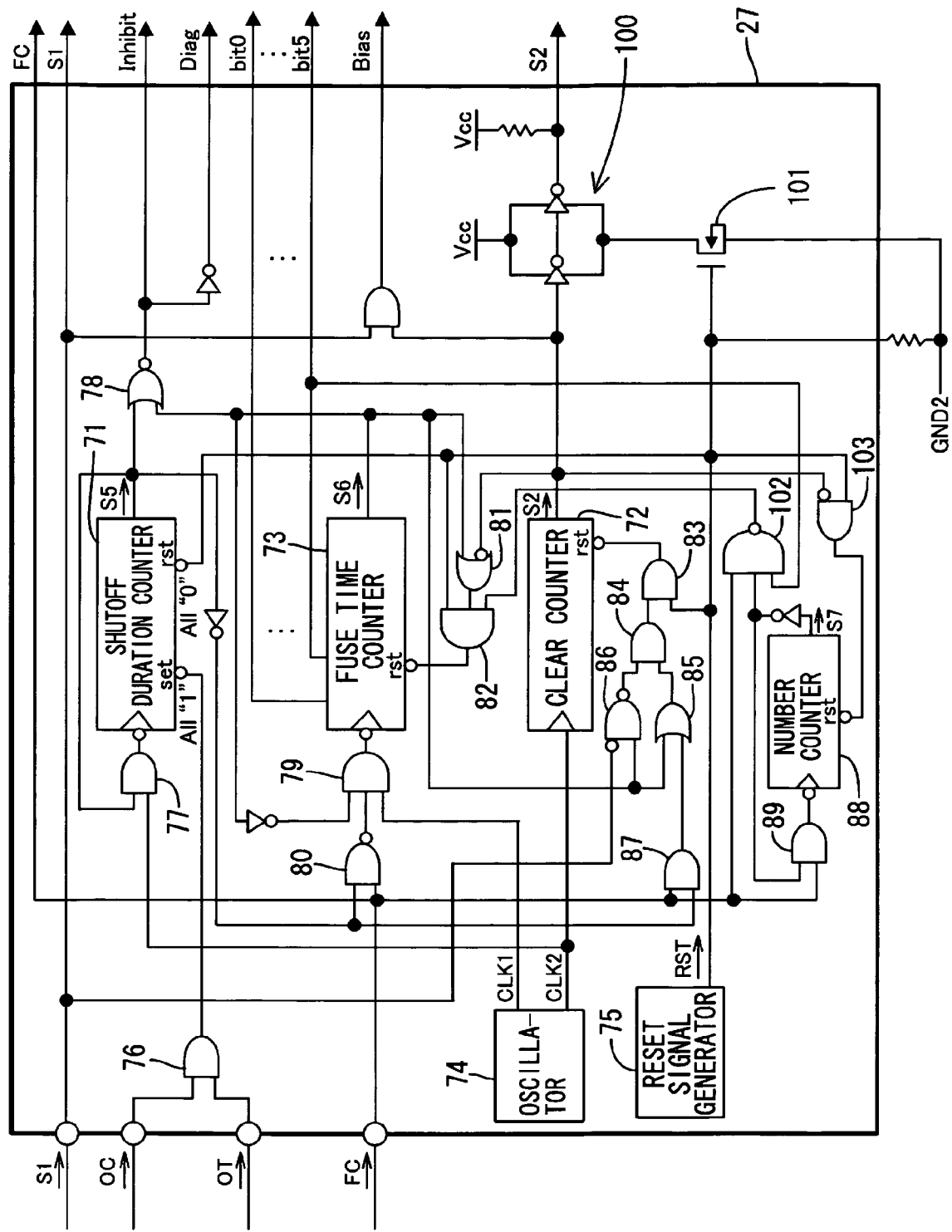
FIG. 6 is a circuit diagram of a control logic portion.

FIG. 6 is a circuit diagram of the control logic portion 27. The control logic portion 27 mainly includes a shutoff duration counter 71, the clear counter 72, the fuse time counter 73, an oscillator 74, a reset signal generator 75, a number counter circuit 88 and the like. The control logic portion 27 receives the control signal S1 from the input interface 22, the first and second abnormal current signals OC, FC from the current detector 24, and the abnormal temperature signal OT from the overheat detector 25 as described above.

a. Oscillator and Reset Signal Generator

The oscillator 74 generates and outputs two clock signals in different periods, i.e., a clock signal CLK1 (in 125 microsecond period, for example) and a clock signal CLK2 (in 4 millisecond period, for example). The reset signal generator 75 generates a constant voltage sufficient for the internal ground generator 23 and the present control logic portion 27 to operate. Further it outputs an output signal RST of low level (i.e., a reset signal), unless and until clock generation of the oscillator 74 is stabilized. When the clock generation is stabilized, an output signal RST of high level is outputted.

b. Shutoff Duration Counter

If at least one of a low-level first abnormal current signal OC from the current detector 24 and a low-level abnormal temperature signal OT from the overheat detector 25 is received, the shutoff duration counter 71 (i.e., an example of "an overcurrent protective circuit") forcibly performs a shutoff operation (i.e., an example of "a first shutoff operation for a semiconductor switching element being performed due to an overcurrent protective function being performed" and "a first shutoff operation for a semiconductor switching element being performed by an overcurrent protective circuit") for the power MOSFET 14 for a predetermined first reference time (i.e., a time corresponding to the countdown from the count value "n" to "0", and specifically 32 milliseconds), and thereafter releases the forcing shutoff state. In the present embodiment, "forcing shutoff" means that the power MOSFET 14 is forcibly turned OFF although the power supply controller 10 is receiving a low-level control signal S1 (ON signal).

Specifically, the shutoff duration counter 71 counts down from the initial value n to zero in synchronization with clocking of the clock signal CLK2. The output signal RST from the reset signal generator 75 is inverted and inputted to the reset terminal of the shutoff duration counter 71. All the n counters thereof are reset to "0" (so that the count value is set to the initial value "n"), while the output signal RST is low level. The reset state is released, when the output signal RST turns to high level. The shutoff duration counter 71 outputs an output signal S5 of low level, when all the n counters are "0" (i.e., during the reset state or when the count value has overflowed). Otherwise, it outputs an output signal S5 of high level for performing a forcing shutoff operation for the power MOSFET 14.

An output signal from an AND circuit 76, to which a first abnormal current signal OC and an abnormal temperature signal OT are inputted, is inverted and inputted to the set terminal of the shutoff duration counter 71. The shutoff duration counter 71 sets all the n counters to "1", when a first abnormal current signal OC of low level due to an overcurrent occurrence or an abnormal temperature signal OT of low level due to a temperature anomaly is received. Then the shutoff duration counter 71 outputs a high-level output signal S5, and thereby an AND circuit 77 validates the clock signal CLK2 from the oscillator 74 so that a countdown operation in synchronization with the clocking is started. The shutoff duration counter 71 performs the countdown according to down edges of the clocking.

After the start of the countdown, the shutoff duration counter 71 outputs an output signal S5 of high level, unless and until the countdown to "0" is completed resulting in overflow. Thereby the clock signal CLK2 is validated by the AND circuit 77 so as to be inputted to the clock terminal of the shutoff duration counter 71. At the time, an OR circuit 78 provides an output signal Inhibit of low level for the gate driver 28 in response to the high-level output signal S5, so that a forcing shutoff operation for the power MOSFET 14 is performed.

In contrast, the shutoff duration counter 71 outputs an output signal S5 of low level, if the countdown to "0" is completed resulting in overflow. Then input of the clock signal CLK2 is inhibited by the AND circuit 77. At the time, the OR circuit 78 provides an output signal Inhibit of high level for the gate driver 28 in response to the low-level output signal 5, so that the forcing shutoff state of the power MOSFET 14 is released. Thereby the power MOSFET 14 is restored to the conductive state, if the power supply controller 10 is receiving a low-level control signal S1 (ON signal).

Figure 10:
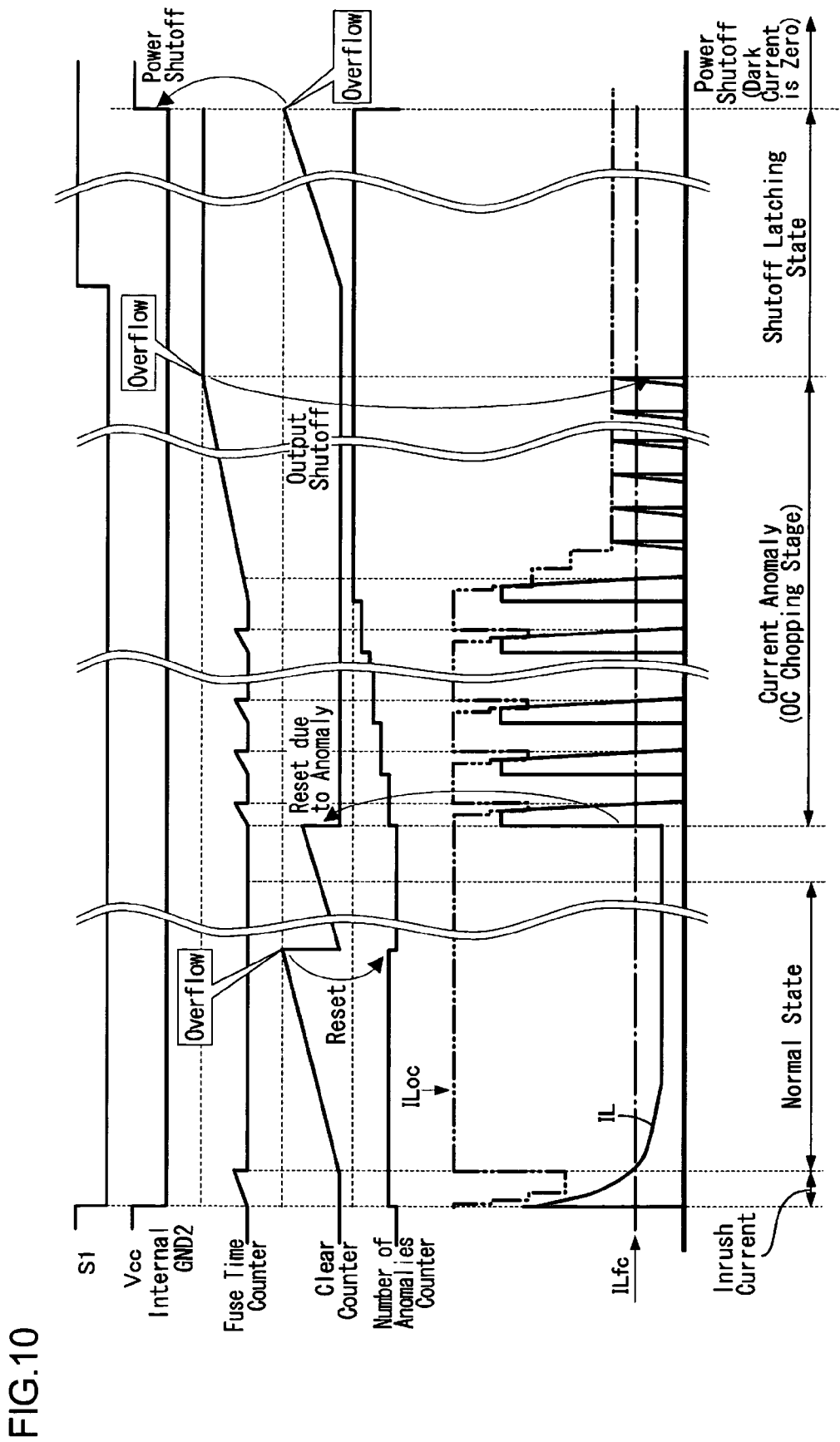
FIG. 10 is a timing chart when the power supply controller receives a constant voltage signal of low level as a control signal.

As described above, the shutoff duration counter 71 immediately initiates a forcing shutoff operation for the power MOSFET 14 whenever the current detector 24 outputs a first abnormal current signal OC of low level in response to an overcurrent state, for example, and releases the forcing shutoff operation when the countdown from n is completed, as shown in FIG. 10 (See "OC Chopping Stage"). Hereinafter, this forcing shutoff, from which the power MOSFET 14 is restored to the conductive state by the shutoff duration counter 71 when a predetermined first reference time has elapsed, is referred to as "first forcing shutoff".

c. Fuse Time Counter

The fuse time counter 73 (i.e., an example of "a time accumulator circuit" and "an anomaly time accumulator circuit") accumulates an anomaly time (hereinafter referred to as "a FUSE time") during which a second abnormal current signal FC of low level is received from the current detector 24 or forcing shutoff is performed for the power MOSFET 14 by the shutoff duration counter 71. A forcing shutoff operation (i.e., an example of "a second shutoff operation for a semiconductor switching element being performed if an accumulated time reaches a third reference time") is performed for the power MOSFET 15, if the accumulated time reaches a predetermined reference FUSE time (which is larger than the first reference time and corresponds to the count from "0" to "m(>n)", and specifically which is 1024 milliseconds and an example of "a third reference time").

Specifically, the fuse time counter 73 counts from the initial value 0 to m in synchronization with clocking of the clock signal CLK1. The fuse time counter 73 performs the count according to down edges of the clocking. More specifically, the fuse time counter 73 outputs an output signal S6 of low level during the count-up operation, and outputs an output signal S6 of high level (i.e., a shutoff signal) if the count to "m" is completed resulting in overflow. The level-inverted signal of an output signal S6 of the fuse time counter 73 and an output signal of a NAND circuit 80 are inputted to an AND circuit 79 provided for validating the clock signal CLK1 from the oscillator 74. The NAND circuit 80 outputs a high-level signal, when a second abnormal current signal FC of low level or a low-level signal, generated by level-inverting a high-level output signal S5 outputted when the shutoff duration counter 71 is performing the countdown operation, is received.

Therefore, when a second abnormal current signal FC of low level is outputted or the shutoff duration counter 71 is performing the countdown operation, the AND circuit 79 validates the clock signal CLK 1 so that the fuse time counter 73 progresses the count-up operation unless it overflows. If the fuse time counter 73 completes the count to "m" resulting in overflow, it thereafter outputs an output signal S6 of high level. At the time, the OR circuit 78 provides an output signal Inhibit of low level for the gate driver 28 in response to the high-level output signal S6, so that a forcing shutoff operation is performed for the power MOSFET 14. Hereinafter, this forcing shutoff due to overflow of the fuse time counter 73 is referred to as "second forcing shutoff". Then the overflow state of the fuse time counter 73 is maintained, because input of the clock signal CLK1 is inhibited due to the high-level output signal S6. Thus the fuse time counter 73 functions also as an output latch circuit.

The count value of the fuse time counter 73 is reset to the initial value "0" in any of the following cases:
(1) An output signal RST of low level is outputted from the reset signal generator 75 (for a reset state);
(2) (Except when the fuse time counter 73 has overflowed) an output signal S2 of high level (i.e., an example of "a clear signal") has been outputted from the clear counter 72 (that is, the clear counter 72 has overflowed); and
(3) (Except when the accumulated time as the FUSE time has reached a reset enabling time) a fuse current is eliminated, without overflow of the number counter circuit 88 described below, so that a second abnormal current signal FC of high level is received. This reset condition (3) will be described later.

Specifically, the level-inverted signal of an output signal S2 from the clear counter 72 and an output signal S6 of the fuse time counter 73 are inputted to an OR circuit 81. An output signal of the OR circuit 81 and an output signal RST of the reset signal generator 75 are inputted to an AND circuit 82. An output signal thereof is level-inverted and inputted to the reset terminal of the fuse time counter 73. Thereby the count value of the fuse time counter 73 is consistently reset to the initial value "0", when an output signal RST of low level is outputted from the reset signal generator 75. An output signal from a NAND circuit 102 is also inputted to the AND circuit 82 as described below.

On the other hand, while an output signal RST of high level is outputted from the reset signal generator 75, the count value is reset to the initial value "0" in response to an output signal S2 of high level from the clear counter 72 unless the fuse time counter 73 has overflowed. In contrast, when the fuse time counter 73 has overflowed, its count value will not be reset even if an output signal S2 of high level is outputted from the clear counter 72, so that the second forcing shutoff state is maintained.

As shown in FIG. 7, the fuse time counter 73 outputs a signal according to the accumulated time (i.e., the count value) accumulated by the count-up operation, or specifically it outputs low-level bit signals "bit 0" to "bit 5" sequentially. Thereby the FETs 61a to 61f are turned on sequentially and selectively, so that the threshold voltage generator 52 decreases the first anomaly threshold voltage Voc (and the first anomaly threshold current ILoc) stepwise with time according to the accumulated time. The accumulated time at the time a low-level bit signal bit5 is outputted is an example of "a reset enabling time" (which is shorter than the reference FUSE time, and 16 milliseconds in the present embodiment, for example). As shown in FIG. 5, the reset enabling time is set based on the time, around which the self-destructive characteristics curvature L2 changes to have a measure of gentleness.

d. Clear Counter

The clear counter 72 (i.e., an example of "a normal duration accumulator circuit" and "a number reset circuit") mainly resets the accumulated time (i.e., the count value) of the fuse time counter 73 to the initial value "0", if a normal state, in which neither a current anomaly nor a temperature anomaly is detected, continues for a predetermined second reference time (corresponding to the count up from "0" to "q", or specifically corresponding to 512 milliseconds) without overflow being reached after the fuse time counter 73 starts the count. Specifically, the clear counter 72 counts from the initial value "0" to "q(<n)" in synchronization with clocking of the clock signal CLK2. The clear counter 72 performs the count according to up edges of the clocking. The second reference time is determined based on the time taken for elimination of the overheat state of the load and the like after elimination of a fuse current or overcurrent state, for example.

The count value of the clear counter 72 is reset to the initial value "0", when the reset signal generator 75 outputs an output signal RST of low level (for a reset state). It is also reset when a second abnormal current signal FC of low level is received from the current detector 24 or forcing shutoff is performed for the power MOSFET 14 by the shutoff duration counter 71, unless the fuse time counter 73 has overflowed after start of its count-up operation. On the other hand, after overflow of the fuse time counter 73, reset is performed in response to a control signal S1 of low level (ON signal).

Specifically, the clear counter 72 directly receives the clock signal CLK 2 from the oscillator 74, and normally outputs an output signal S2 of low level. If the count to "q" is completed resulting in overflow, an output signal S2 of high level is outputted for one clocking period, for example. An output signal RST from the reset signal generator 75 is inputted to an AND circuit 83, and an output signal thereof is level-inverted and applied to the reset terminal of the clear counter 72. Thereby the count value is reset to the initial value "0", when the reset signal generator 75 outputs an output signal RST of low level.

An output signal from an AND circuit 84 is inputted to the AND circuit 83. An output signal from an OR circuit 85 and an output signal from a NAND circuit 86 are inputted to the AND circuit 84. An output signal from an AND circuit 87 and an output signal S6 from the fuse time counter 73 are inputted to the OR circuit 85. A second abnormal current signal FC and the level-inverted signal of an output signal S5 of the shutoff duration counter 71 are inputted to the AND circuit 87. According to this construction, unless the fuse time counter 73 has overflowed after start of its count-up operation, the count value of the clear counter 72 is reset when a second abnormal current signal FC of low level due to a fuse current is received or when forcing shutoff for the power MOSFET 14 is performed by the shutoff duration counter 71, as described above.

An output signal S6 of the fuse time counter 73 and the level-inverted signal of a control signal S1 are inputted to the NAND circuit 86. Thereby the clear counter 72 is reset, when a control signal S1 of low level (ON signal) is received after overflow of the fuse time counter 73 as described above.

e. Number Counter

The number counter circuit 88 (i.e., an example of "a threshold initialization circuit") mainly performs an initialization operation for restoring the first anomaly threshold voltage Voc (and the first anomaly threshold current ILoc), which have been decreased stepwise with time, to the initial level, if a second abnormal current signal FC of high level is received due to elimination of a fuse current after a second abnormal current signal FC of low level is received due to the fuse current. The initialization operation is performed x times (i.e., an example of "a predetermined number of times, and seven times in the present embodiment, for example) at most.

Specifically, the number counter circuit 88 counts the number of times a second abnormal current signal FC of low level is inputted to the control logic portion 27, up to y(=X+1), for example. The number counter circuit outputs an output signal S7 of low level unless and until overflow is reached, and outputs an output signal S7 of high level when it has overflowed. An output of an AND circuit 89 is level-inverted and inputted to the number counter circuit 88. A second abnormal current signal FC and the level-inverted signal of an output signal S7 of the number counter circuit 88 are inputted to the AND circuit 89. A second abnormal current signal FC, the level-inverted signal of an output signal S7 of the number counter circuit 88 and a bit signal bit5 described above are inputted to the NAND circuit 102. An output signal of the NAND circuit 102 is applied to the AND circuit 82 described above.

According to this construction, when a bit signal bit5 of high level is received from the fuse time counter 73 (i.e., unless and until the accumulated time of the fuse time counter 73 reaches the reset enabling time), the number counter circuit 88 increments its count value one by one at times when a second abnormal current signal FC of low level is inputted to the AND circuit 89 unless its count value has overflowed. At this time, a second abnormal current signal FC of low level, a high-level signal generated by level-inverting an output signal S7 of the number counter circuit 88, and the high-level bit signal "bit5" are inputted to the NAND circuit 102.

When a second abnormal current signal FC of high level is inputted due to elimination of a fuse current, an output signal of low level from the NAND circuit 102 is inputted to the AND circuit 82 so that the accumulated time (i.e., the count value) of the fuse time counter 73 is reset to the initial value "0" (because of the above reset condition (3) described in "c. Fuse Time Counter"). Thus the initialization operation for restoring the first anomaly threshold voltage Voc (and the first anomaly threshold current ILoc) to the initial level is performed.

On the other hand, when the count value of the number counter circuit 88 has overflowed, a low-level signal generated by level-inverting an output signal S7 of the number counter circuit 88 is inputted to the NAND circuit 102. Thereby a high-level output signal is inputted from the NAND circuit 102 to the AND circuit 82 irrespective of whether the second abnormal current signal FC and the bit signal "bit5" are high level or low level. Then reset of the accumulated time of the fuse time counter 73 by the number counter circuit 88, i.e., the initialization operation cannot be performed.

Further, when a bit signal bit5 of low level is received from the fuse time counter 73 (i.e., when the accumulated time of the fuse time counter 73 reaches the reset enabling time), a high-level output signal is inputted from the NAND circuit 102 to the AND circuit 82 irrespective of whether the second abnormal current signal FC and the level-inverted signal of the output signal S7 of the number counter circuit 88 are high level or low level. Then reset of the accumulated time of the fuse time counter 73 by the number counter circuit 88, i.e., the initialization operation cannot be performed, even if the count value of the number counter circuit 88 has not overflowed. Thus the number counter circuit 88 and the NAND circuit 102 function as "a reset disabling circuit".

The level-inverted signal of an output signal from an AND circuit 103 is inputted to the reset terminal of the number counter circuit 88. The level-inverted signal of an output signal S2 from the clear counter 72 and an output signal RST from the reset signal generator 75 are inputted to the AND circuit 103. According to this construction, the count value of the number counter circuit 88 is reset to zero while the reset signal generator 75 outputs an output signal RST of low level (i.e., a reset signal). On the other hand, during an output signal RST of high level being outputted from the reset signal generator 75, the count value of the number counter circuit 88 is reset to zero when the clear counter 72 outputs an output signal S2 of high level (i.e., a clear signal) due to its overflow. Thus the clear counter 72 functions as "a number reset circuit" and "a normal duration accumulator circuit".

(Gate Driver)

Figure 8:
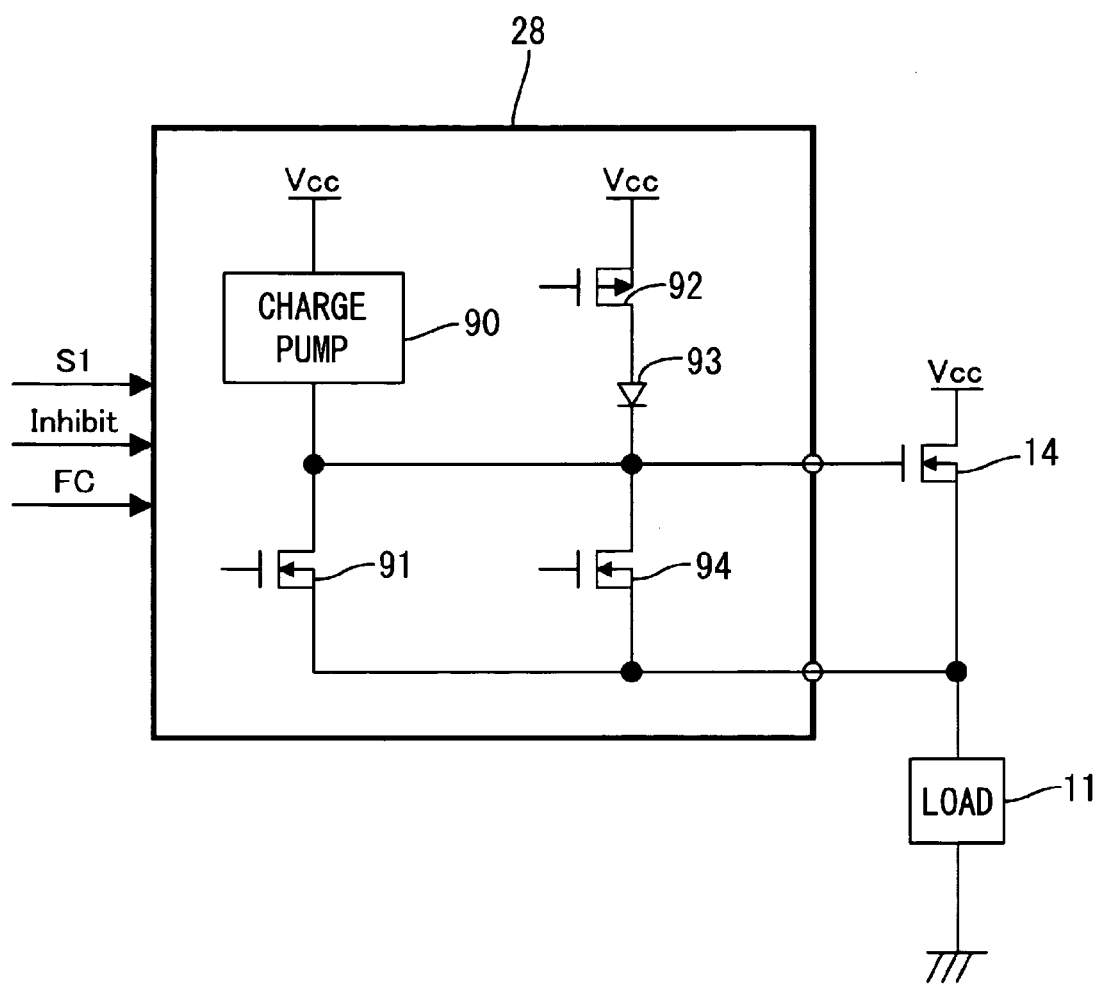
FIG. 8 is a schematic diagram showing the construction of a gate driver.
Figure 9A:
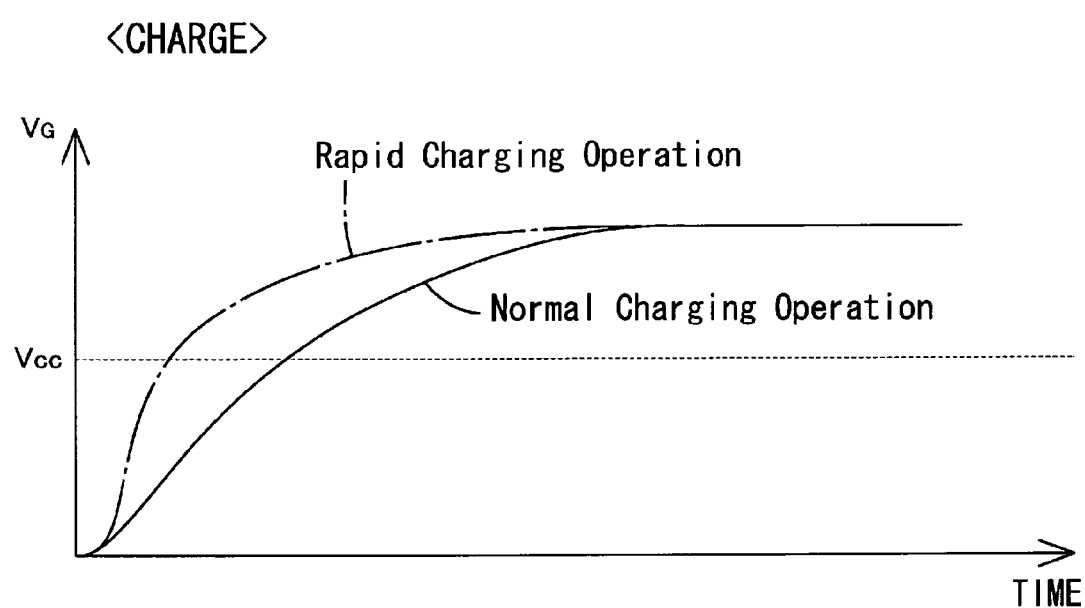
FIG. 9A is a graph showing the relation between the gate voltage and charging time.
Figure 9B:
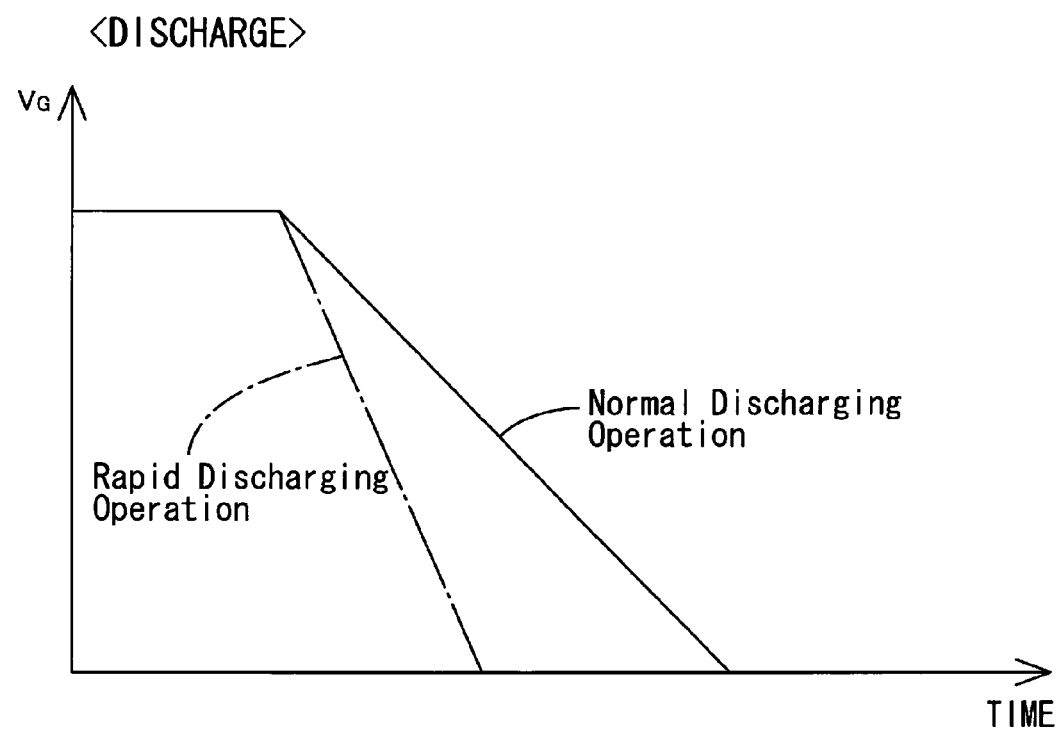
FIG. 9B is a graph showing the relation between the gate voltage and discharging time.

FIG. 8 is a schematic diagram showing the construction of the gate driver 28. To the gate driver 28, the control signal S1, the second abnormal current signal FC and the output signal Inhibit are inputted from the control logic portion 27. The gate driver 28 includes a charge pump 90 connected between the power supply terminal P2 and the gates of the power MOSFET 14 and sense MOSFET 18 (omitted from the figure), and further includes a normal discharge FET 91 connected between the gates and sources of the power MOSFET 14 and sense MOSFET 18. Moreover, the gate driver 28 includes an urgent charge FET 92 and a diode 93 connected between the power supply terminal P2 and the gates of the power MOSFET 14 and sense MOSFET 18, and further includes an urgent discharge FET 94 connected between the gates and sources of the power MOSFET 14 and the sense MOSFET 18.

In a normal state wherein neither a current anomaly nor a temperature anomaly has occurred, the charge pump 90 solely operates in response to a low-level control signal S1 (ON signal) so as to apply a higher voltage, generated from the power supply voltage Vcc, to between the gate and source of each of the power MOSFET 14 and the sense MOSFET 18. Thus, a normal charging operation is performed (See FIG. 9A) for turning ON the power MOSFET and the sense MOSFET, resulting in a conductive state. On the other hand, in response to a high-level control signal S1 (OFF signal), the charge pump 90 discontinues generation of a higher voltage while the normal discharge FET 91 is solely turned on, so that the charge between the gate and source of each of the power MOSFET 14 and the sense MOSFET 18 is released. Thus, a normal discharging operation or a shutoff operation is performed (See FIG. 9B).

In contrast, when a low-level control signal S1 (ON signal) is received during reception of a second abnormal current signal FC of low level, the charge pump 90 and the urgent charge FET 92 are turned on so that the voltage rapidly rises to the power supply voltage Vcc. Thus a rapid charging operation is performed (See FIG. 9A). When a high-level control signal S1 (OFF signal) is received during reception of a second abnormal current signal FC of low level, the urgent discharge FET 94 as well as the normal discharge FET 91 are turned on so that the charge between the gate and source of each of the power MOSFET 14 and the sense MOSFET 18 is released rapidly. Thus a rapid discharging operation, i.e., a shutoff operation is performed (See FIG. 9B).

The gate driver 28 also performs the rapid discharging operation when a low-level output signal Inhibit is received (i.e., when the first or second forcing shutoff should be performed).

OPERATION AND EFFECT OF THE PRESENT EMBODIMENT

In Case of an Inrush Current that will not Exceed the Temporally Changing First Anomaly Threshold Current ILoc FIG. 10 is a timing chart concerning the case that the power supply controller 10 receives a constant voltage signal of low level as a control signal S1. In response to the control signal S1 of low level, the internal ground generator 23 generates the internal ground GND2. When the internal ground GND2 is stabilized, the reset signal generator 75 outputs an output signal RST of high level so that the reset state of each of the counters 71-73, 88 is released.

The low-level control signal S1 is applied to the gate driver 28, and thereby the power MOSFET 14 and the like are turned on resulting in a conductive state. Then an inrush current higher than the second anomaly threshold current ILfc passes into the power MOSFET 14. However, a first forcing shutoff operation due to the inrush current can be prevented from being performed for the power MOSFET 14 and the like, because the initial level of the first anomaly threshold current ILoc is higher than the inrush current.

The fuse time counter 73 starts a count-up operation, because the load current IL exceeds the second anomaly threshold current ILfc due to the occurrence of the inrush current. The count value is incremented until the load current IL falls below the second anomaly threshold current ILfc and, during this time, the first anomaly threshold current ILoc is decreased with time. In the present embodiment, the number counter circuit 88 increments its count value by one at the time when the load current IL exceeds the second anomaly threshold current ILfc.

Thereafter, the accumulated time of the fuse time counter 73 is reset when the load current IL falls below the second anomaly threshold current ILfc, so that the initialization operation for restoring the first anomaly threshold current ILoc to the initial level is performed. If a normal state (See "Normal State" in FIG. 10), in which the load current IL is lower than the second anomaly threshold current ILfc, continues for a second reference time, the clear counter 72 overflows and the count value of the number counter circuit 88 is reset.

In the case of a construction wherein another semiconductor switching element on the power supply line 13 is provided on the downstream side (the load 11 side) of the power MOSFET 14 and repeatedly switched between on and off at predetermined time intervals (equal to or longer than the second reference time) while maintaining the power MOSFET 14 ON, for example, an inrush current may occur repeatedly. Even in this case, a first forcing shutoff operation due to the inrush current can be prevented from being performed for the power MOSFET 14 and the like, because the first anomaly threshold current ILoc is restored to the initial level whenever the inrush current occurs.

In case that a current anomaly due to short-circuiting in the load 11 or the like occurs, the count-up operation by the fuse time counter 73 starts from the initial value when the load current IL exceeds the second anomaly threshold current ILfc. Then the first anomaly threshold current ILoc is decreased with time again, and the count value of the number counter circuit 88 is incremented by one. When the load current IL during this anomaly exceeds the first anomaly threshold current ILoc, a first forcing shutoff operation is performed for the power MOSFET 14 and the like. Thereby the load current IL will fall below the second anomaly threshold current ILfc and, at this time, the initialization operation is performed.

When the shutoff counter 71 has overflowed (i.e., when a first reference time has elapsed) after the initiation of the first forcing shutoff operation, the power MOSFET 14 and the like are restored to the conductive state. As long as the current anomaly state continues, the first forcing shutoff operation and restoration to the conductive state are repeated (See "OC Chopping Stage" in FIG. 10). In this stage, unless the repeat count of the initialization operation reaches seven (i.e., unless the number counter circuit 88 completes the count to eight), the accumulated time of the fuse time counter 73 is reset and the first anomaly threshold current ILoc is restored to the initial level whenever the initialization operation is performed.

After the repeat count of the initialization operation reaches seven (i.e., after the number counter circuit 88 completes the count to eight), the initialization operation is disabled so that the OC chopping can be performed according to the first anomaly threshold current ILoc of the lowest level which has been obtained by decreasing that with time. Then an overcurrent can be detected based on the first threshold current ILoc of the lowest level. If the overcurrent or fuse current state continues resulting in overflow of the fuse time counter 73, a second forcing shutoff operation is performed for the power MOSFET 14 and the like.

Note that the second anomaly threshold current ILfc is set to a level slightly higher than the rated current ILmax of the load 11. The reference FUSE time is set to a time shorter than the time taken for the electric wire 30 to emit smoke when a fuse current, i.e., a current higher than the second anomaly threshold current ILfc, is intermittently detected at intervals shorter than the second reference time. Therefore, a chattering short, i.e., an abnormal current that occurs in a fraction of the stranded wires of the electric wire 30 at intervals shorter than the second reference time due to short-circuiting in the fraction of the stranded wires, can be detected without the electric wire 30 reaching smoke emission, so that the second forcing shutoff operation can be performed for the power MOSFET 14.

In a holding state wherein the second forcing shutoff is maintained, the clear counter 72 is reset while a control signal S1 of low level is received, so as to output an output signal S2 of low level. Therefore, the count value of the fuse time counter 73 cannot be reset as long as a control signal S1 of low level is inputted (See "Latching State" in the figure). When the power supply controller 10 receives a control signal S1 of high level (OFF signal), the clear counter 72 starts a count-up operation.

Then in the internal ground generator 23, the FET 41 turns off in response to the high-level control signal S1, while the FET 42 is maintained on because of a low-level output signal S2 so that the conductive state is maintained. Therefore, even in the case that a vehicle driver performs an operation after initiation of the second forcing shutoff so that a control signal S1 of high level (OFF signal) is inputted and, immediately after that, a control signal S1 of low level (ON signal) is inputted, for example, the second forcing shutoff state can be maintained if the time interval therebetween is shorter than the second reference time.

On the other hand, if a control signal S1 of high level (OFF signal) is inputted to the input terminal P1 continuously for a second reference time, the clear counter 72 overflows so that an output signal S2 of high level is applied to the internal ground generator 23. Then the operation thereof terminates. Thereby, reduction of the charge amount of the power source 12 (e.g., a vehicle battery), due to a dark current passing from the power source 12 into the ground via the internal ground generator 23, can be since prevented. At the time, the reset signal generator 75 outputs an output signal RST of low level so that the count value of each of the counters 71-73, 88 is reset. In response to the output signal RST of low level, an FET 101 turns off so that a high-level holding circuit 100 operates. Thereby the output signal S2 is fixed to high level, and therefore generation of the internal ground GND2 by the internal ground generator 23 is maintained off although the count value of the clear counter 72 is reset.

(In Case of an Inrush Current that will Exceed the Temporally Changing First Anomaly Threshold Current ILoc)

In order to prevent self-destruction of the power MOSFET 14, the level of the first anomaly threshold current ILoc changing with time should be set to values within the area where a current level is lower than the self-destructive characteristics curvature L2, for a time domain corresponding to the reference FUSE time, as described above. Further, the initial level of the first anomaly threshold current ILoc should be set so as to be as high as possible in order that forcing shutoff due to an inrush current of the highest level is prevented. For meeting these requirements, in the present embodiment, the first anomaly threshold current ILoc is set to a level as close to the self-destructive characteristics curvature L2 as possible for a time domain corresponding to the reference FUSE time, so as to change along the self-destructive characteristics curvature L2 over time as shown in FIG. 5.

However, an inrush current changing more gradually than assumed in the design phase, i.e., than that shown in FIG. 5, may occur, if the load resistance during the start-up of the load is high for some reasons or if parts have a variation due to manufacturing reasons, for example. Specifically, in the case that the load 11 is a motor for a cooling fan or a wiper, for example, the inrush current may change gradually with time (i.e., the time constant may be large), if snow accumulates or ice forms on the cooling fan or the wiper resulting in high load resistance.

Figure 11:
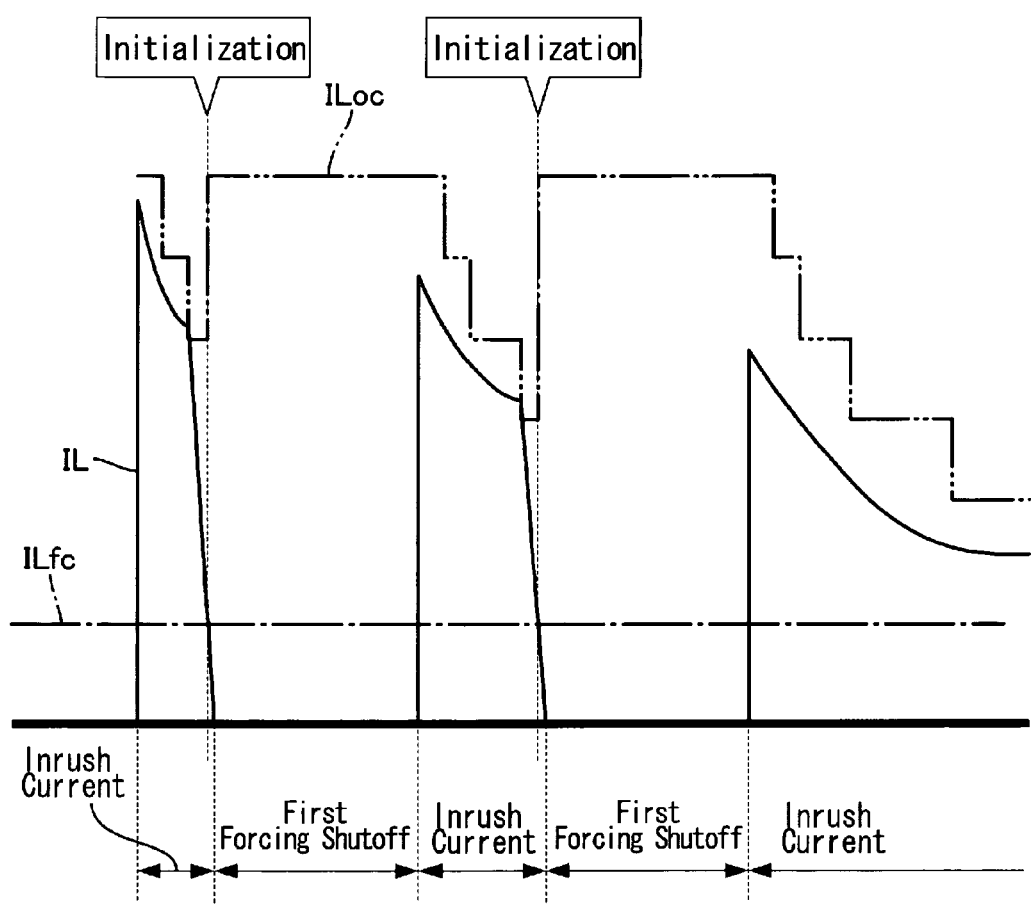
FIG. 11 is a timing chart when an inrush current, which exceeds the first anomaly threshold current, has occurred.

In this case, as shown in FIG. 11, for example, the inrush current having occurred may exceed the first anomaly threshold current ILoc which has been decreased stepwise with time. Then a first forcing shutoff operation is performed for the power MOSFET 14 even in the power supply controller 10 according to the present embodiment. At the time, the initialization operation is performed for restoring the first anomaly threshold current ILoc to the initial level. If an inrush current occurs again when the power MOSFET 14 is restored to the conductive state after the first forcing shutoff operation, the initialization operation will be performed again. The initialization operation will be thus repeated several times and, during this time, the load resistance of the load 10 is gradually reduced due to the intermittent current supply. Then the repetition of current supply and immediate forcing shutoff terminates, so that normal control for power supply to the load 11 can be started.

Figure 12:
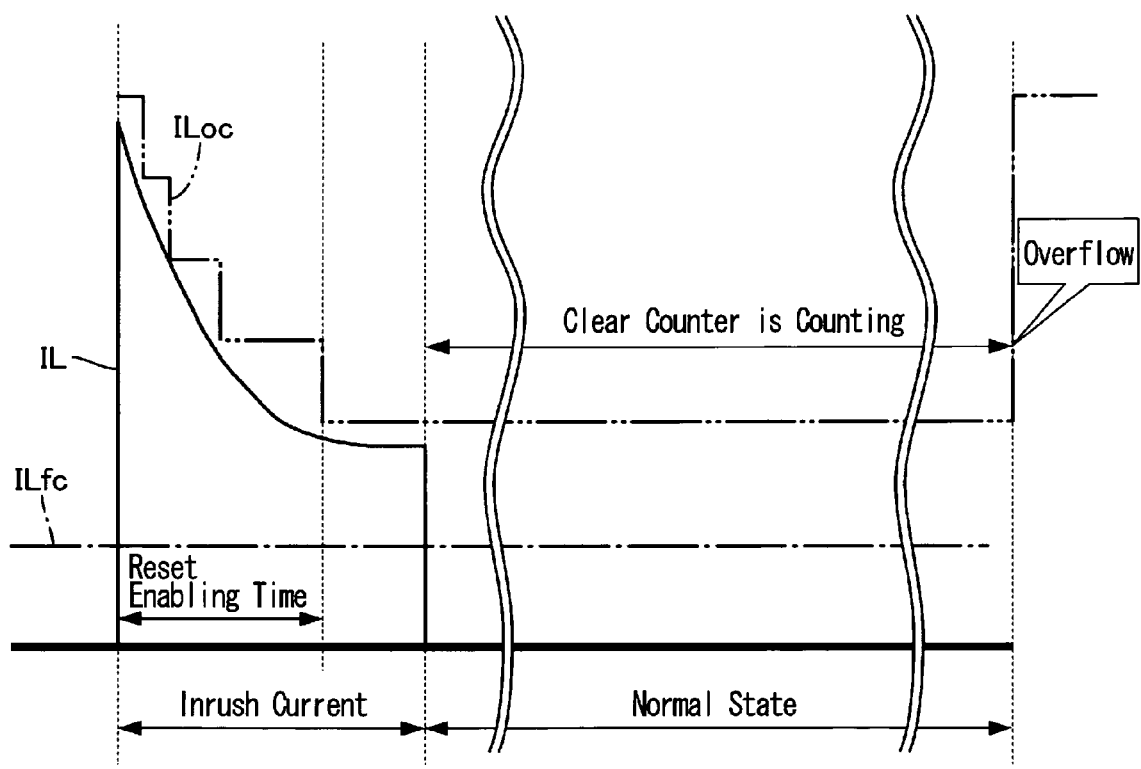
FIG. 12 is a timing chart when an inrush current, which does not exceed the first anomaly threshold current and varies extremely gradually, has occurred.

Further, an inrush current, which continues not to be higher than the first anomaly threshold current ILoc but to be higher than the second anomaly threshold current Ilfc for a relatively long time, may occur, as shown in FIG. 12, for example. In this case, when the inrush current or the load current IL thereafter falls below the second anomaly threshold current ILfc resulting in a normal state, the initialization operation cannot be performed if the accumulated time of the fuse time counter 73 at the time is equal to or longer than the reset enabling time. That is, the accumulated time of the fuse time counter 73, having been accumulated, cannot be reset. While further accumulating the FUSE time, detection of an overcurrent can be performed based on the first anomaly threshold current ILoc which is of the lowest level as a result of having been decreased. This is because it is preferable to prioritize achievement of the fuse function (i.e., a protective function for an external circuit) when the FUSE time accumulated by the fuse time counter 73 thus reaches a considerable value. If the normal state continues for a second reference time after the inrush current has died down, the clear counter 72 overflows as shown in FIG. 12. Then the accumulated time of the fuse time counter 73 is reset, and thereby the first anomaly threshold current ILoc is restored to the initial level.

Figure 13:
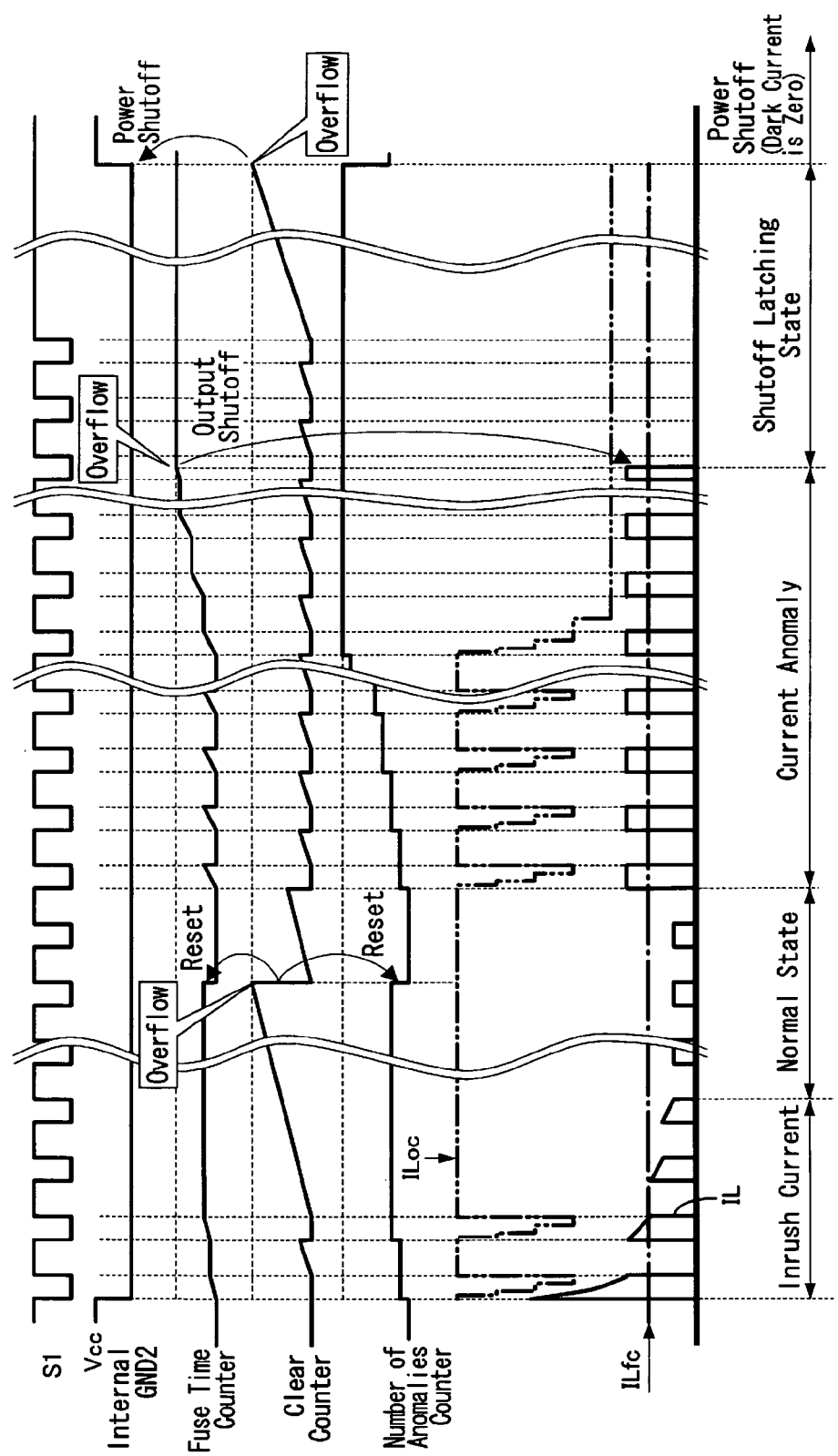
FIG. 13 is a timing chart when the power supply controller receives a PWM signal as a control signal.

FIG. 13 is a timing chart concerning the case that the power supply controller 10 receives, as a control signal S1, a PWM signal alternating between high and low levels. In this case, the second reference time is set so as to be longer than the off period (i.e., a duration of high level, and an example of "a shutoff period during which a semiconductor switching element is maintained in a shutoff state due to an OFF signal") of the PWM signal. Thereby, in the case that a PWM signal is inputted as a control signal S1 to the input terminal P1, overflow of the clear counter 72 and consequent output of a high-level output signal S2 can be prevented during every off period, i.e., while a control signal S1 of high level due to the off period is inputted. Thus the internal ground generator 23 can be prevented from terminating its operation during input of a PWM signal. Further, after an anomaly state has occurred, reset of the count value of the fuse time counter 73 and consequent restoration of the first anomaly threshold current ILoc to the initial level due to the received PWM signal being high level can be prevented, and therefore detection of an overcurrent can be performed based on the first anomaly threshold current ILoc of the lowest level. Further, even in the case that a PWM signal is thus received as a control signal S1, the effects of a measure against an inrush current and a fuse function can be achieved similarly to the above case that a constant voltage signal is received as a control signal S1.

Second Embodiment

Hereinafter, a second embodiment of the present invention will be explained with reference to FIGS. 14 and 20. In the drawings, an overbar attached to a symbol indicating each of various signals represents that the signal is a low active signal. The same constructions as the first embodiment are designated by the same symbols, and redundant explanation may be omitted.

1. Construction of Power Supply Controller

Figure 14:
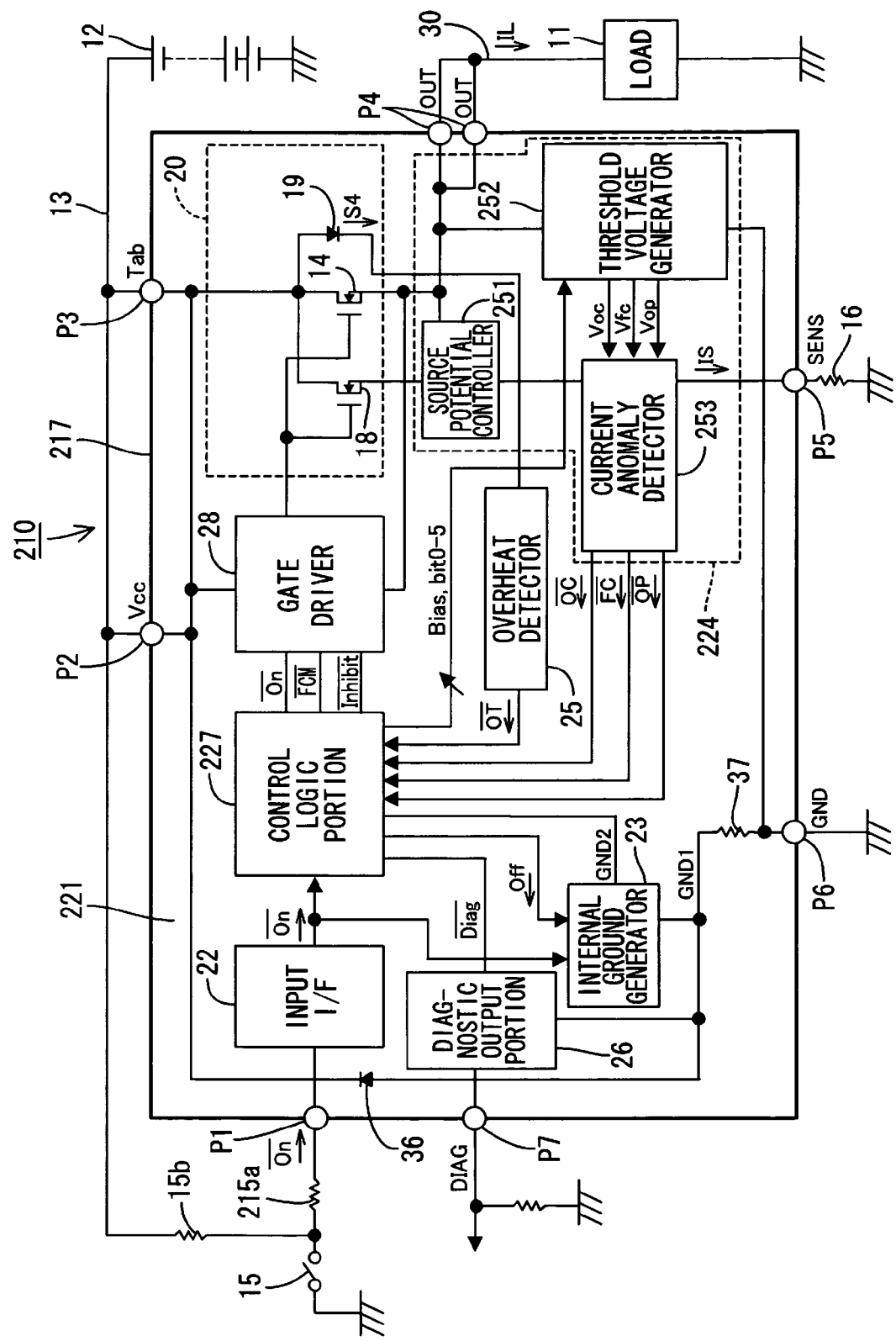
FIG. 14 is a block diagram showing the general construction of a power supply controller according to a second embodiment.

FIG. 14 is a block diagram of the general construction of a power supply controller 210 according to the present embodiment. The power supply controller 210 can be installed on a vehicle not shown, and used for control of the power supply from a power source 12 to a load 11.

As shown in FIG. 14, the power supply controller 210 is formed as a semiconductor device 217 (semiconducting device), on which an input terminal P1, a power supply (Vcc) terminal P2 and a tab terminal P3 to be connected to the power source 12, a load connecting terminal P4 to be connected to the load 11, an external terminal P5 to be connected to the ground (GND) via an external resistor 16 as a current-voltage converter circuit, a ground terminal P6 to be connected directly to the ground (GND), and a diagnostic output terminal P7 are provided. In the present embodiment, a power MOSFET 14, a sense MOSFET 18 as a sense FET described below and a temperature sensor 19 are configured onto a single chip as a power chip 20, which is mounted on a control chip 221 that includes the other circuits.

Figure 15:
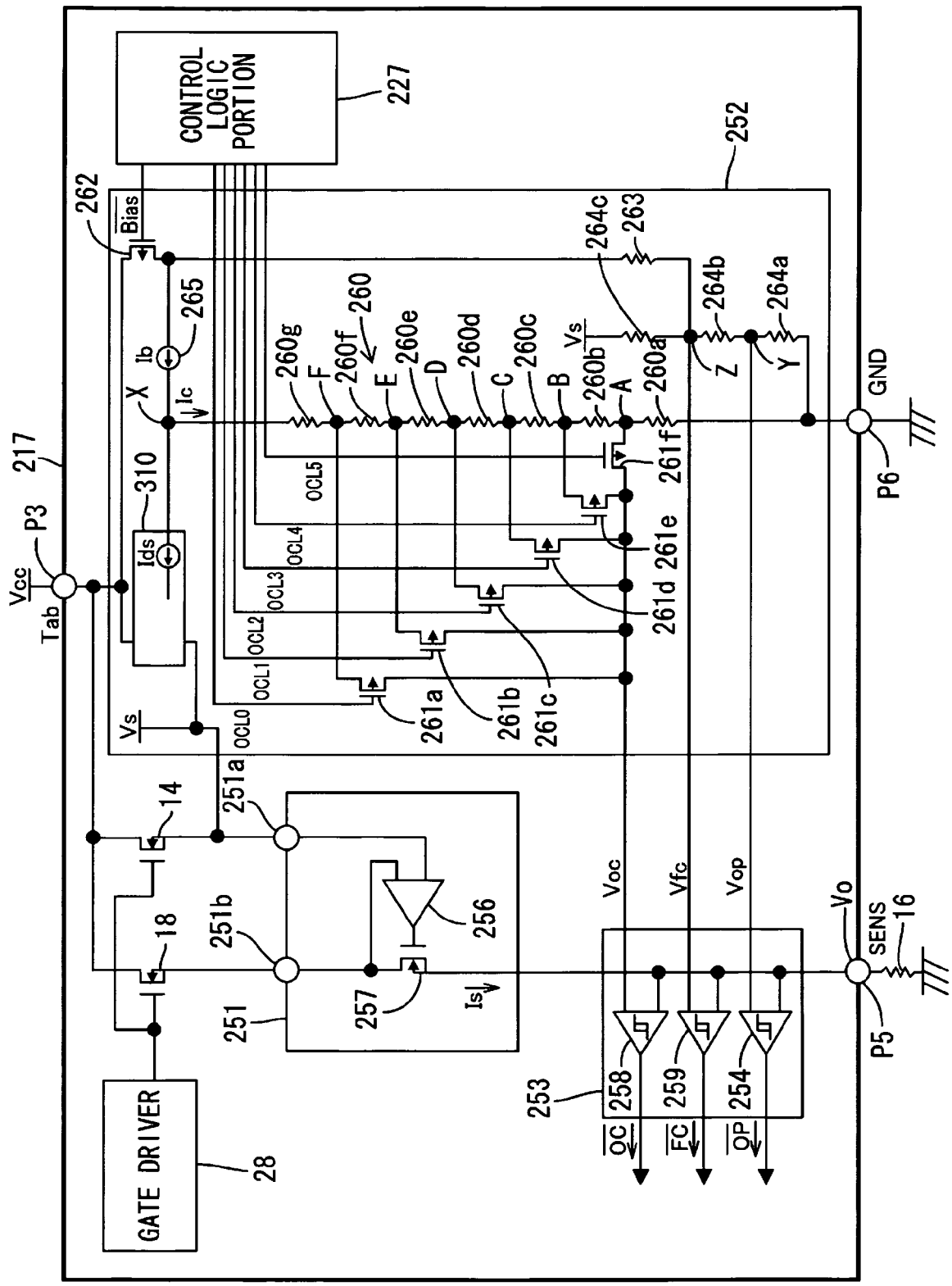
FIG. 15 is a circuit diagram of a source potential controller, a threshold voltage generator and a current anomaly detector.

A plurality of n-channel MOSFETs are arranged on the power chip 20. The drains of the MOSFETs are connected in common to one another, and further connected to the tab terminal P3. As shown in FIG. 15, the sources of most of the MOSFETs are connected in common to a power FET input 251a of a source potential controller 251 described below and the load connecting terminal P4, so that the MOSFETs form the power MOSFET 14. The sources of the rest of the MOSFETs are connected in common to a sense FET input 251b of the source potential controller 251, so that the MOSFETs form the sense MOSFET 18. The ratio of the number of MOSFETs constituting the sense MOSFET 18 to the number of MOSFETs constituting the power MOSFET 14 corresponds approximately to a sense ratio k.

The control chip 221 mainly includes an input interface 22, an internal ground generator 23, a current detector 224, an overheat detector 25, a diagnostic output portion 26, a control logic portion 227, and a gate driver 28. In the present embodiment, the input interface 22 receives a control signal On (corresponding to the control signal S1 of the first embodiment) of high level when an operation switch 15 is OFF, while the input interface receives a control signal On of low level (low active) when the operation switch is ON. The input interface provides the received control signal On for the internal ground generator 23 and the control logic portion 227. The low-level control signal On corresponds to an ON signal (a load ON signal). The nonactive control signal On corresponds to an OFF signal. In the present embodiment, the overheat detector 25 determines an temperature anomaly when a temperature signal S4 indicating a temperature higher than a predetermined threshold temperature is received, and provides a temperature anomaly signal OT of low level (low active) for the control logic portion 227.

The internal ground generator 23 operates when it receives an active control signal On (ON signal) from the input interface 22 or a low-level output signal Off (designated by symbol S2 in FIG. 3, and indicating that a clear counter 272 has not overflowed) from the control logic portion 227 described below, so as to generate an internal ground GND2 lower than the power supply voltage Vcc by a predetermined constant voltage Vb.

(Current Detector)

The current detector 224 includes a source potential controller 251, a threshold voltage generator 252, and a current anomaly detector 253 as shown in FIG. 14. FIG. 15 is a circuit diagram mainly showing the source potential controller 251, the threshold voltage generator 252 and the current anomaly detector 253. The rest of the circuit construction is partly omitted from the diagram.

a. Source Potential Controller

The source potential controller 251 is provided for maintaining the output side voltages (i.e., the source voltages) of the power MOSFET 14 and the sense MOSFET 18 to be equal to each other.

The source potential controller 251 includes an operational amplifier 256 and an FET 257 as a switching element. The pair of input terminals of the operational amplifier 256 are connected to the power FET input 251a (i.e., to the source of the power MOSFET 14) and the sense FET input 251b (i.e., to the source of the sense MOSFET 18), respectively. The FET 257 is connected between the sense FET input 251b and the external terminal P5, and the output of the operational amplifier 256 is applied to the control terminal thereof. More specifically, the negative input of the operational amplifier 256 is connected to the power FET input 251a, while the positive input of the operational amplifier 256 is connected to the sense FET input 251b. The differential output of the operational amplifier 256 is fed back to the positive input through between the gate and drain of the FET 257.

The operational amplifier 256 is maintained in an imaginary short state due to the feedback of the differential output of the operational amplifier 256, that is, the potentials of the positive input and negative input are maintained almost equal to each other. Thereby the potentials of the drains of the power MOSFET 14 and the sense MOSFET 18 are maintained equal to each other, and the potentials of the sources thereof are also maintained equal to each other. Consequently, a sense current Is passing through the sense MOSFET 18 is stably maintained to a constant ratio (i.e., the sense ratio k) to a load current IL passing through the power MOSFET 14.

b. Current Anomaly Detector

The current anomaly detector 253 includes one comparator or a plurality (e.g., three in the present embodiment) of comparators 254, 258, 259 (e.g., hysteresis comparators in the present embodiment). The terminal voltage Vo of the external terminal P5 is applied to one input of each comparator 254, 258, 259.

The comparator 258 (i.e., an example of "a first abnormal current detecting circuit") receives a first anomaly threshold voltage Voc on the other input thereof from the threshold voltage generator 252, and outputs an overcurrent signal OC of low level (i.e., a low active signal, and an example of "a first abnormal current signal") to the control logic portion 227 when the terminal voltage Vo exceeds the first anomaly threshold voltage Voc. Hereinafter, a load current IL, passing through the power MOSFET 14 when the terminal voltage Vo reaches the first anomaly threshold voltage Voc, i.e., during a current anomaly, is called "a first anomaly threshold current ILoc" (i.e., an example of "a first threshold"), and this current anomaly is called "an overcurrent".

The comparator 259 (i.e., an example of "a second abnormal current detecting circuit") receives a second anomaly threshold voltage Vfc (<Voc) on the other input thereof from the threshold voltage generator 252, and outputs a fuse current signal FC of low level (i.e., a low active signal, and an example of "a second abnormal current signal") to the control logic portion 227 when the terminal voltage Vo exceeds the second anomaly threshold voltage Vfc. Hereinafter, a load current IL, passing through the power MOSFET 14 when the terminal voltage Vo reaches the second anomaly threshold voltage Vfc, i.e., during a current anomaly, is called "a second anomaly threshold current ILfc" (i.e., an example of "a second threshold"), and this current anomaly is called "a fuse current".

The comparator 254 receives a third anomaly threshold voltage Vop on the other input thereof from the threshold voltage generator 252, and outputs a breaking indication signal OP of low level (low active) to the control logic portion 227 when the terminal voltage Vo is lower than the third anomaly threshold voltage Vop. Hereinafter, a load current IL, passing through the power MOSFET 14 when the terminal voltage Vo reaches the third anomaly threshold voltage Vop, is called "a third anomaly threshold current ILop", and this anomaly is called "a wire-breaking anomaly".

c. Threshold Voltage Generator

As shown in FIG. 15, the threshold voltage generator 252 (i.e., an example of "a threshold adjustment circuit") mainly includes a current output circuit 310, which outputs a current Ic indicating the difference determined by subtracting a current Ids (<Ib) corresponding to the drain-to-source voltage Vds of the power MOSFET 14 (i.e., an input-to-output voltage of a semiconductor switching element) from a current Ib corresponding to a predetermined constant voltage, and further includes a threshold setting resistor 260, through which the output current Ic from the current output circuit 310 passes.

Specifically, the current output circuit 310 is connected between the drain and source of the power MOSFET 14, and thereby causes a current Ids corresponding to the drain-to-source voltage Vds thereof to pass into the ground terminal P6. Further, an FET 262, which turns on in response to a bias signal Bias as described below, and a constant current circuit 265, which causes the current Ib, are connected between the input terminal, provided on the current output circuit 310 for receiving the current Ids, and the power supply terminal P2. A plurality of threshold setting resistors (e.g., seven threshold setting resistors 260a-260g in the present embodiment) are serially connected between the connecting point X, between the above input terminal and the constant current circuit 265, and the ground terminal P6, so that the above third current Ic passes through the threshold setting resistors 260a-260g. Divided voltages at the respective connecting points A-F between the threshold setting resistors 260a-260g vary in proportion to the third current Ic (=Ib−Ids), i.e., in proportion to a voltage corresponding to the difference determined by subtracting the drain-to-source voltage Vds of the power MOSFET 14 from the constant voltage. According to this construction, the first anomaly threshold current ILoc decreases with increase of the drain-to-source voltage Vds of the power MOSFET 14, and increases with decrease.

Therefore, if short-circuiting in the load 11 occurs immediately after turn-on of the power MOSFET 14, the first anomaly threshold current ILoc is then set to a relatively low level because the drain-to-source voltage Vds is relatively high. Consequently, the load current IL can reach the first anomaly threshold current ILoc early without reaching a high level, i.e., when it is relatively low level, and thereby the current detector 224 can output an active signal OC early. Further, in case that the power supply voltage Vcc decreases, for example, the first anomaly threshold current ILoc is maintained substantially equal to the level before the decrease of the power supply voltage Vcc. This is because, even if the power supply voltage Vcc decreases, the drain-to-source voltage Vds is almost maintained as long as the power MOSFET 14 is ON. Therefore the power supply operation of the power MOSFET 14 can be sufficiently achieved in this case.

The threshold voltage generator 252 further includes a plurality of FETs 261a-261f as switching elements for connecting the other input terminal of the comparator 258 selectively to the connecting points A-F between the threshold setting resistors 260a-260g. Thereby the first anomaly threshold voltage Voc can be decreased stepwise by turning on the FETs 261a-261f selectively and sequentially. The ON-OFF switching of the FETs 261a-261f is controlled by the control logic portion 227 as described below.

On the other hand, the second and third anomaly threshold voltages Vfc and Vop vary with the source voltage Vs (i.e., an output side voltage of a semiconductor switching element) of the power MOSFET 14. Specifically, a plurality of voltage-dividing resistors (e.g., three threshold setting resistors 264a-264c in the present embodiment) are serially connected between the source of the power MOSFET 14 and the ground terminal P6. The divided voltage at the connecting point Y between the threshold setting resistors 264a and 264b is outputted as the third anomaly threshold voltage Vop, while the divided voltage at the connecting point Z between the threshold setting resistors 264b and 264c is outputted as the second anomaly threshold voltage Vfc.

Therefore, in case that a fuse current occurs immediately after turn-on of the power MOSFET 14, the second anomaly threshold current ILfc is then set to a relatively low level because the drain-to-source voltage Vds is relatively high. Consequently, the load current IL can reach the second anomaly threshold current ILfc early without reaching a high level, i.e., when it is relatively low level, and thereby the current detector 224 can output an active fuse current signal FC early.

Figure 16:
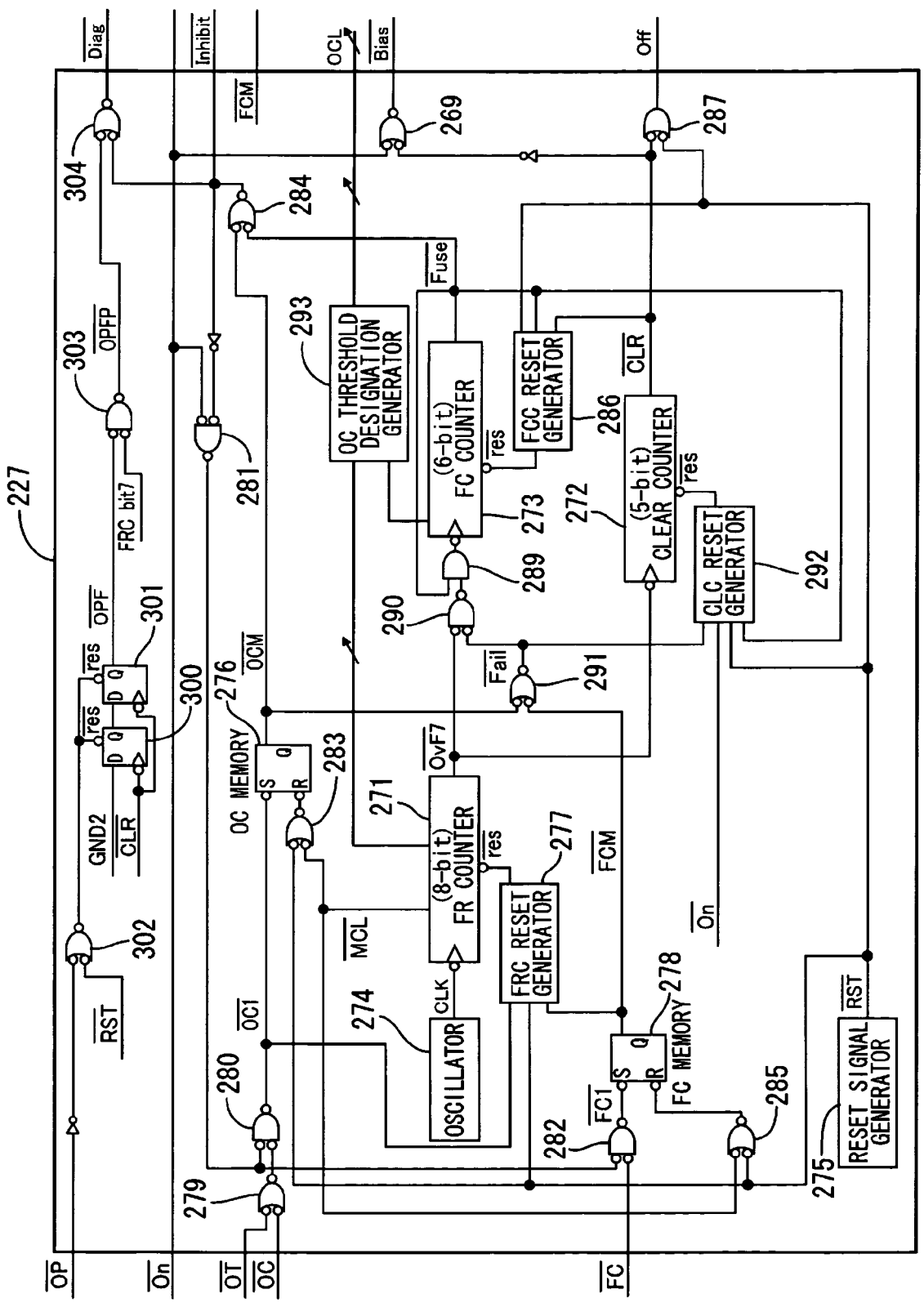
FIG. 16 is a circuit diagram of a control logic portion.

In the present embodiment, the FET 262, which is a switching element that turns on in response to a low-level (low active) bias signal Bias from the control logic portion 227, and a resistor 263 are provided between the power supply terminal P2 and the connecting point Z, and thereby the second and third anomaly threshold currents ILfc and ILop are biased so as not to decrease to a negative level with variation of the load resistance of the load 11. When the FET 262 turns on, a current passes through the resistor 263 and thereby the second and third anomaly threshold voltages Vfc and Vop are pulled up to the power supply voltage Vcc side by a voltage corresponding to a voltage drop on the resistor 263. The low-level bias signal Bias is outputted from the control logic portion 227 for turning on the FET 262, when the control signal On is active or the clear signal CLR is nonactive. Specifically, as described below, a NOR circuit 269, to which a level-inverted signal of the control signal On and a clear signal CLR from the clear counter 272 are inputted, is provided in the control logic portion 227 as shown in FIG. 16, and the NOR circuit 269 can output a low-level (low active) bias signal Bias. On the other hand, the first anomaly threshold current ILoc can be biased by designing so that 'Ib−Ids>0' is satisfied. Thus the second current Ib can function as a bias.

The first anomaly threshold current ILoc and the second anomaly threshold current ILfc are the same as the above first embodiment (See FIG. 5). The third anomaly threshold current ILop is set to a further lower level than the rated current ILmax. The comparator 254 detects a wire-breaking anomaly when the load current IL reaches the third anomaly threshold current ILop, and outputs an active breaking indication signal OP.

(Control Logic Portion)

FIG. 16 is a circuit diagram of the control logic portion 227. The control logic portion 227 mainly includes an FR counter (i.e., a free-running counter) 271, the clear counter 272, a fuse counter (FC counter) 273, an oscillator 274, a reset signal generator 275 and the like. The control logic portion 227 receives the control signal On from the input interface 22, the signals OC, FC, OP from the current detector 224, and the temperature anomaly signal OT from the overheat detector 25 as described above.

a. Oscillator and Reset Signal Generator

The oscillator 274 generates and outputs a clock signal CLK (in 125 microsecond period, for example). The reset signal generator 275 generates a constant voltage sufficient for the internal ground generator 23 and the present control logic portion 227 to operate. Further it outputs a reset signal RST of low level (low active), unless and until clock generation of the oscillator 274 is stabilized. After the clock generation is stabilized, a reset signal RST of high level is outputted.

b. Overcurrent Protective Circuit

If at least one of an active overcurrent signal OC from the current detector 224 and an active temperature anomaly signal OT from the overheat detector 25 is received, the overcurrent protective circuit mainly performs a forcing shutoff operation of the power MOSFET 14 for a predetermined first reference time, and thereafter releases the forcing shutoff state. Specifically, the overcurrent protective circuit includes the FR counter 271, an OC memory 276, an FRC reset generator 277, an FC memory 278 and the like.

The control logic portion 227 includes a NOR circuit 279, which receives the level-inverted signals of the signals OC, OT, and further includes a NAND circuit 280, which receives the level-inverted signal of an output signal from the NOR circuit 279. The level-inverted signal of a set signal OC1 from the NAND circuit 280 is inputted to the set terminal of the OC memory 276 (i.e., an RS flip-flop). The level-inverted signal of an output signal of a NAND circuit 281 is also inputted to the NAND circuit 280. The level-inverted signal of a control signal On and a forcing shutoff signal Inhibit (which is low level when forcing shutoff of the power MOSFET 14 should be performed) described below are inputted to the NAND circuit 281.

According to this construction, while an active control signal On is inputted, the NAND circuit 280 outputs a set signal OC1 of low level (low active), if at least one of an active overcurrent signal OC from the current detector 224 and an active temperature anomaly signal OT from the overheat detector 25 is inputted to the control logic portion 227 and the forcing shutoff signal Inhibit is high level. That is, while an ON signal is inputted, the NAND circuit 280 outputs an active set signal OC1 so that the OC memory 276 is turned to the set state, if an overcurrent or a temperature anomaly is detected and the power MOSFET 14 is not in the forcing shutoff state.

The control logic portion 227 further includes a NAND circuit 282, to which the level-inverted signal of an output signal of the NAND circuit 281 and the level-inverted signal of a fuse current signal FC are inputted. The level-inverted signal of a (low active) set signal FC1 from the NAND circuit 282 is inputted to the set terminal of the FC memory 278 (i.e., an RS flip-flop). According to this construction, while a low-level control signal On is inputted, the NAND circuit 282 outputs a set signal FC1 of low level (low active), if an active fuse current signal FC from the current detector 224 is inputted to the control logic portion 227 and the forcing shutoff signal Inhibit is high level. That is, while an ON signal is inputted, the NAND circuit 282 outputs an active set signal FC1 so that the FC memory 278 is turned to the set state, if a fuse current is detected and the power MOSFET 14 is not in the forcing shutoff state.

The FR counter 271 (i.e., an example of "a free-running counter circuit") normally counts a predetermined time repeatedly, and is reset to "1" (i.e., the least significant bit is set to "1" and the other bits are set to "0") when any of the following reset conditions 1-3 is satisfied. In the present embodiment, the FR counter 271 is an 8-bit free-running counter, for example, and increments its count value one by one at times corresponding to down edges of the clock signal CLK from the oscillator 274 (i.e., in 125 microsecond periods). The FR counter overflows every 32 milliseconds, unless it is reset.

Reset Condition 1: The reset signal generator 275 outputs an active reset signal RST;

Reset Condition 2: The NAND circuit 280 outputs an active set signal OC1 (i.e., an overcurrent or a temperature anomaly is detected, and the power MOSFET 14 is not in the forcing shutoff state); and Reset Condition 3: The output signal FCM of the FC memory 278 is turned from high level to low level (i.e., the FRC reset generator 277 detects a down edge of the output signal FCM, or a fuse current is detected when the power MOSFET 14 is not in the forcing shutoff state).

When any of the above reset conditions 1-3 is satisfied, the FRC reset generator 277 (i.e., an example of "free-running counter reset circuit") outputs a reset signal res of low level (low active) so that the FR counter 271 is temporarily turned to the reset state. The FR counter 271 outputs a count signal OvF7 of low level (i.e., a low active signal, and an example of "a count-up signal"), when the seven lower bits of the FR counter 271 overflow (i.e., all the bits are "1"). Further it outputs a shutoff release signal MCL of low level (low active), when all the seven lower bits are "0". That is, the FR counter 271 outputs an active count signal OvF7 at a predetermined time interval (e.g., at a 16-millisecond interval), unless it is reset. Further it outputs an active shutoff release signal MCL at the above predetermined time interval, or more specifically, a predetermined time (one count in the present embodiment) later than the output of a count signal OvF7.

The level-inverted signal of an output signal from a NOR circuit 283 is inputted to the reset terminal of the OC memory 276 as a shutoff circuit. The level-inverted signal of a reset signal RST from the reset signal generator 275 and the level-inverted signal of a shutoff release signal MCL from the FR counter 271 are inputted to the NOR circuit 283. According to this construction, the OC memory 276 turns to the set state in response to an active set signal OC1 as described above, so as to output a first forcing shutoff signal OCM of low level (low active). It outputs a first forcing shutoff signal OCM of high level, when the reset signal RST or the shutoff release signal MCL is active.

A NOR circuit 284 receives the level-inverted signal of a first forcing shutoff signal OCM and the level-inverted signal of a second forcing shutoff signal Fuse from the fuse counter 273 described below, and it outputs a forcing shutoff signal Inhibit of low level (low active) when the first forcing shutoff signal OCM or the second forcing shutoff signal Fuse is active.

According to this construction, the overcurrent protective circuit outputs an active first forcing shutoff signal OCM from the OC memory 276 when the overcurrent signal OC or the temperature anomaly signal OT is active, so that forcing shutoff for the power MOSFET 14 is performed immediately. At the same time, the FR counter 271 is reset to restart the count, and thereafter, i.e., 16 milliseconds (i.e., an example of "a first reference time") later, it outputs an active shutoff release signal MCL so that the OC memory 276 outputs a high-level first forcing shutoff signal OCM and thereby the forcing shutoff (first forcing shutoff) state of the power MOSFET 14 is released. The power MOSFET 14 can be thus restored to the conductive state as long as the power supply controller 210 receives an active control signal On.

The level-inverted signal of an output signal from a NOR circuit 285 is inputted to the reset terminal of the FC memory 278. The level-inverted signal of a reset signal RST from the reset signal generator 275 and the level-inverted signal of a shutoff release signal MCL from the FR counter 271 are inputted to the NOR circuit 285. According to this construction, the FC memory 278 turns to the set state in response to an active set signal FC1 as described above, so as to output an output signal FCM of low level (low active). Further it outputs an output signal FCM of high level, when the reset signal RST or the shutoff release signal MCL is active. The FC memory 278 continues to output an active output signal FCM as long as the set signal FC1 is active, even if the reset signal RST is active.

c. Fuse Anomaly Protective Circuit

A fuse anomaly protective circuit (i.e., an example of "an anomaly time accumulator circuit") mainly accumulates an anomaly time (hereinafter referred to as "a FUSE time") during which an active fuse current signal FC is received from the current detector 224 or first forcing shutoff for the power MOSFET 14 is performed by the overcurrent protective circuit. The fuse anomaly protective circuit causes a forcing shutoff operation for the power MOSFET 14, if the accumulated time reaches a predetermined reference FUSE time (i.e., an example of "a third reference time", and longer than the first reference time). Specifically, the fuse anomaly protective circuit includes the fuse counter 273, an FCC reset generator 286 and the like.

The fuse counter 273 (i.e., an example of "a fuse counter circuit") is a 6-bit counter, for example, and increments its count value one by one at times corresponding to down edges of the count signal OvF7 from the FR counter 271, for example. Unless the fuse counter is reset, it overflows when 1024 milliseconds are reached, and outputs a second forcing shutoff signal Fuse of low level (low active). The count value of the fuse counter 273 when it overflows is an example of "a reference anomaly count value". More specifically, the level-inverted signal of an output signal of an AND circuit 289 is inputted to the clock input terminal of the fuse counter 273. The second forcing shutoff signal Fuse from the fuse counter 273 and an output signal from a NAND circuit 290 are inputted to the AND circuit 289. The level-inverted signal of a count signal OvF7 from the FR counter 271 and the level-inverted signal of an anomaly notification signal Fail from a NOR circuit 291 are inputted to the NAND circuit 290.

The level-inverted signal of a first forcing shutoff signal OCM and the level-inverted signal of an output signal FCM are inputted to the NOR circuit 291, which outputs an anomaly notification signal Fail of low level (low active) when the first forcing shutoff signal OCM or the output signal FCM is active. That is, the NOR circuit 291 is provided for notifying the fuse counter 273 or a CLC reset generator 292 described below that first forcing shutoff is being performed due to an overcurrent or a temperature anomaly, or that a fuse current has occurred (i.e., a second forcing shutoff could be performed later).

When the anomaly notification signal Fail is active, the fuse counter 273 increments its count value one by one at times corresponding to down edges of the count signal OvF7 as long as the second forcing shutoff signal Fuse is nonactive (i.e., unless it overflows). When the counter overflows, it outputs an active second forcing shutoff signal Fuse so that a forcing shutoff operation for the power MOSFET 14 is performed. At the same time, the count operation according to the count signal OvF7 terminates, and the forcing shutoff state is maintained (This is second forcing shutoff).

On the other hand, the FCC reset generator 286 as an anomaly time clear circuit resets the count value of the fuse counter 273 to "0", when the following reset condition 4 or 5 is satisfied.

Reset Condition 4: The reset signal generator 275 outputs an active reset signal RST; and Reset Condition 5: The second forcing shutoff signal Fuse is nonactive (i.e., high level) and the clear signal CLR is active (i.e., the clear counter 272 has overflowed).

An OC threshold designation generator 293 obtains the count values of the fuse counter 273 and the FR counter 271, and sequentially outputs threshold designation signals OCL0-OCL5 of low level (low active) based on the count value of the higher 5 bits of the FR counter 271 (i.e., the time counted by the FR counter 271) as shown in FIG. 17. Thereby the FETs 261a-261f of the threshold voltage generator 252 are turned on selectively and sequentially, so that the first anomaly threshold voltage Voc (and also the first anomaly threshold current ILoc) are decreased stepwise with time according to the counted time. When the count value of the fuse counter 273 is equal to or larger than eight (i.e., an example of "an initialization limit count value"), for example, the OC threshold designation generator 293 invariably outputs an active threshold designation signal OCL5, so that the first anomaly threshold voltage Voc (and also the first anomaly threshold current ILoc) are maintained to the lowest level.

d. Clear Counter

If a normal state, in which neither a current anomaly nor a temperature anomaly is detected (i.e., the load current IL is a normal level lower than the second anomaly threshold current ILfc and the first anomaly threshold current ILoc), continues for a predetermined second reference time without overflow being reached after the fuse counter 273 starts the count, the clear counter 272 (i.e., an example of "a clear counter circuit") as a normal duration accumulator circuit mainly outputs a clear signal CLR of low level (low active) so that the FUSE time (i.e., the count value) of the fuse counter 273 is reset to the initial value "0". The second reference time is determined based on the time taken for elimination of the overheat state of an external circuit after elimination of a fuse current or overcurrent state, for example. The count value of the clear counter 272 when a normal state continues for the second reference time is an example of "a reference clear count value".

Specifically, the clear counter 272 is a 5-bit counter, for example, and increments its count value one by one at times corresponding to down edges of the count signal OvF7 from the FR counter 271, for example. Unless the clear counter is reset, it overflows and outputs an active clear signal CLR, when 512 milliseconds (i.e., an example of a second reference time) are reached. The CLC reset generator 292 (i.e., an example of "a normal duration reset circuit") resets the count value of the clear counter 272 to "0", when any of the following reset conditions 6-8 is satisfied.

Reset Condition 6: The reset signal generator 275 outputs an active reset signal RST;

Reset Condition 7: The second forcing shutoff signal Fuse is nonactive (i.e., second forcing shutoff has not been performed yet) and the anomaly notification signal Fail is active; and Reset Condition 8: The second forcing shutoff signal Fuse is active (i.e., second forcing shutoff is being performed) and the control signal On is active.

The control logic portion 227 further includes an OR circuit 287 for outputting the output signal Off, to which the level-inverted signal of a clear signal CLR and the level-inverted signal of a reset signal RST are inputted. The OR circuit 287 outputs an output signal Off of high level so that the internal ground generator 23 terminates its operation, when the clear signal CLR or the reset signal RST is active.

f. Invalidation Circuit

As described above, the NAND circuit 281 receives the level-inverted signal of a control signal On and the forcing shutoff signal Inhibit described below (which is low level when forcing shutoff for the power MOSFET 14 should be performed). The output signal thereof is level-inverted and inputted to the NAND circuits 280 and 282. According to this construction, the NAND circuit 281 outputs a high-level output signal, when a nonactive control signal On (OFF signal) is received. Thereby the outputs of the NAND circuits 280, 282 are maintained high level so that the OC memory 276 or the FC memory 278 would not turn to the set state, even if the current anomaly detector 253 outputs an active overcurrent signal OC or an active fuse current signal FC, or the overheat detector 25 outputs an active temperature anomaly signal OT. That is, the active overcurrent signal OC, fuse current signal FC and temperature anomaly signal OT are invalidated (or masked).

For example, in the case that the load 11 is an L-load, the source voltage of the power MOSFET 14 may be pulled to the negative side due to the surge voltage of the load 11, when the power MOSFET 14 is turned OFF in response to a nonactive control signal On (OFF signal). Therefore, the second and third anomaly threshold voltages Vfc and Vop, which are generated based on the source voltage, may be also negative. Then an active fuse current signal FC or breaking indication signal OP as an anomaly signal may be outputted from the current anomaly detector 253, even if a fuse current or a wire-breaking anomaly has not occurred. However, in the present embodiment, the invalidation circuit invalidates an active fuse current signal FC when a nonactive control signal On is inputted. Thereby the fuse counter 273 is prevented from incrementing the count, and consequently a second forcing shutoff operation can be prevented.

g. Filter Circuit

A filter circuit includes a counter circuit comprising a plurality of memory circuits (e.g., two memory circuits 300, 301 (e.g., D flip-flops) in the present embodiment) serially connected to one another. The internal ground GND2 is applied to the D-terminal of the memory circuit 300, and the Q-terminal thereof is connected to the D-terminal of the next memory circuit 301. The clear signal CLR is inputted to the set terminals of both memory circuits 300, 301, and an output signal from a NOR circuit 302 is inputted to the reset terminals. The level-inverted signal of a reset signal RST from the reset signal generator 275 and the breaking indication signal OP are inputted to the NOR circuit 302.

According to this construction, while the reset signal RST is nonactive and the breaking indication signal OP is active, the filter circuit outputs a breaking anomaly signal OPF of low level (low active) from the Q terminal of the memory circuit 301 if it has received an active clear signal CLR two or more times (e.g., two times in the present embodiment). On the other hand, the filter circuit is reset when the following reset condition 9 or 10 is satisfied.

Reset Condition 9: The reset signal generator 275 outputs an active reset signal RST; and Reset Condition 10: The breaking anomaly signal OPF is nonactive (i.e., high level).

That is, the breaking anomaly signal OPF is not immediately turned to active, if the current detector 224 outputs an active breaking indication signal OP. It is turned to active, when an active clear signal CLR has been received two times from the clear counter 272 (i.e., when at least the second reference time has elapsed since the output of the active breaking indication signal OP).

The breaking anomaly signal OPF outputted from the Q-terminal of the memory circuit 301 is level-inverted, and inputted to a NAND circuit 303. A bit signal corresponding to one bit of the FR counter 271 is inputted to the NAND circuit 303, so that the NAND circuit 303 outputs a pulsed breaking anomaly signal OPFP, which is pulsed according to the inverted level of the bit signal, when the breaking anomaly signal OPF is active. In the present embodiment, the bit signal FRC7 corresponding to the most significant bit is inputted to the NAND circuit 303, and thereby the pulsed breaking anomaly signal OPFP is outputted in 32 millisecond periods with a duty ratio of 50%.

On the other hand, when the breaking anomaly signal OPFP turns to nonactive, the filter circuit immediately outputs a nonactive (high-level) breaking anomaly signal OPFP (as a normal signal) indicating a normal state. The level-inverted signal of the breaking anomaly signal OPFP and the level-inverted signal of a forcing shutoff signal Inhibit from the NOR circuit 284 are outputted as a diagnostic signal Diag via a NOR circuit 304, and provided for the diagnostic output portion 26. The diagnostic output portion 26 provides a pulsed diagnostic output on the diagnostic output terminal P7, when the breaking anomaly signal OPF is active. It provides a stepwise diagnostic output, when the forcing shutoff signal Inhibit is active. According to this construction, a wire-breaking anomaly can be distinguished from the other anomalies (i.e., an overcurrent, a fuse current and a temperature anomaly) by the diagnostic output.

As described above, in the control logic portion 227, the count of an anomaly time by the fuse anomaly protective circuit and the count of a normal duration by the normal duration accumulator circuit are performed by using the lower bits of the count value of the common free-running counter 271. Thereby, the circuit elements of the control logic circuit 227 can be reduced compared to a construction in which the fuse anomaly protective circuit and the normal duration accumulator circuit perform the count by individually using the lower bits of separate counter circuits. Further, the number counter circuit 88 included in the first embodiment need not be additionally provided, and the overcurrent protective circuit also uses the above free-running counter 271 for counting the first reference time. Thereby the circuit elements can be further reduced.

(Gate Driver)

To the gate driver 28, the control signal On, the output signal FCM and the forcing shutoff signal Inhibit are inputted from the control logic portion 227. The gate driver 28 includes a charge pump (not shown) connected between the power supply terminal P2 and the gates of the power MOSFET 14 and sense MOSFET 18, and further includes a discharge FET (not shown) connected between the gates and sources of the power MOSFET 14 and sense MOSFET 18.

When the gate driver 28 receives an active control signal On (ON signal) from the control logic portion 227, the charge pump solely operates so as to apply a higher voltage, generated from the power supply voltage Vcc, to between the gate and source of each of the power MOSFET 14 and the sense MOSFET 18. Thus, a charging operation is performed for turning ON the power MOSFET and the sense MOSFET, resulting in a conductive state. On the other hand, when the gate driver 28 receives a nonactive control signal On (OFF signal) from the control logic portion 227 or an active forcing shutoff signal Inhibit (indicating that first or second forcing shutoff should be performed), the charge pump discontinues generation of a higher voltage while the discharge FET is solely turned on, so that the charge between the gate and source of each of the power MOSFET 14 and the sense MOSFET 18 is released. Thus, a discharging operation or a shutoff operation is performed.

2. Operation According to the Present Embodiment

Figure 18:
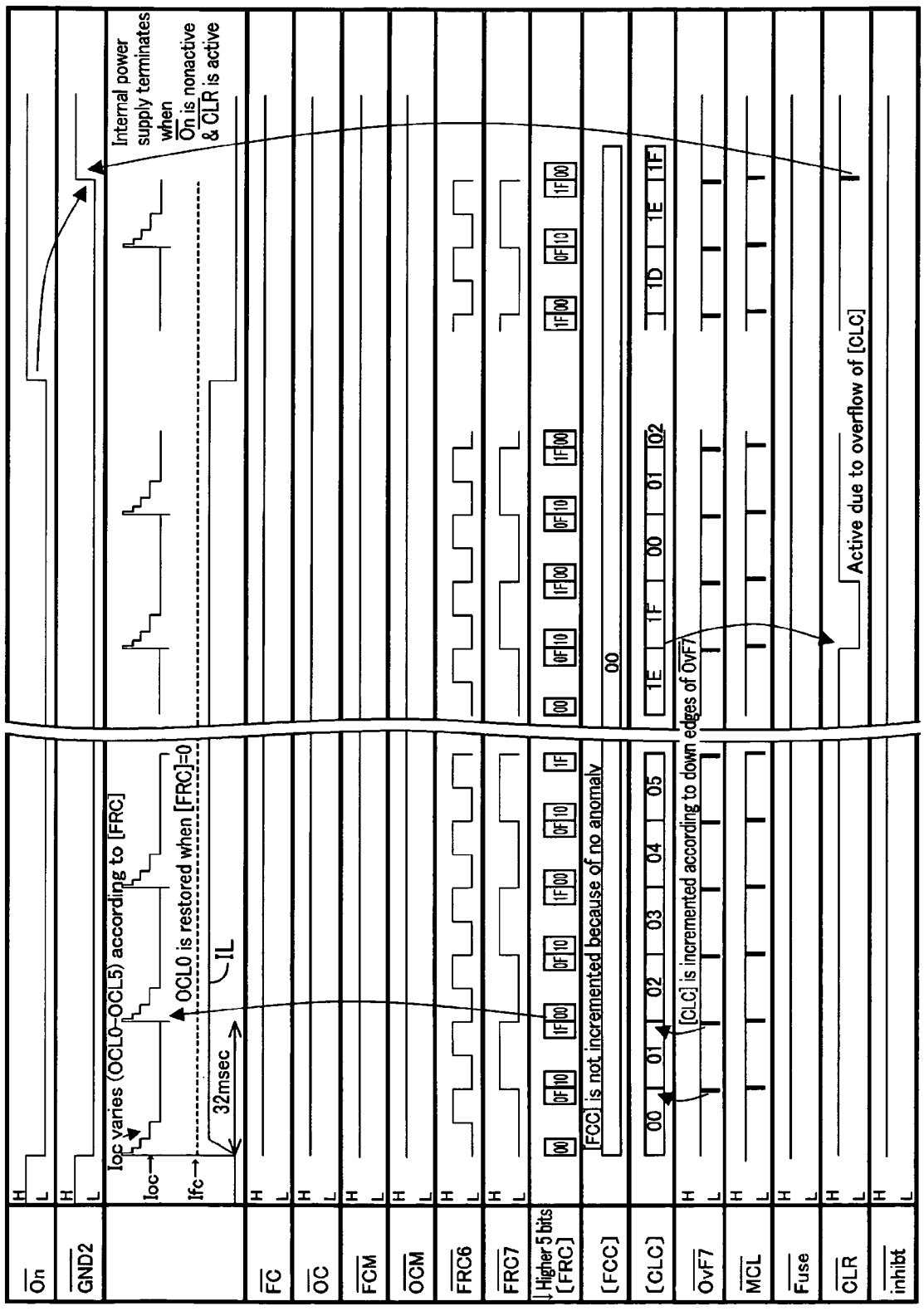
FIG. 18 is a timing chart of various signals for illustrating an operation of the power supply controller (during a normal state)
Figure 19:
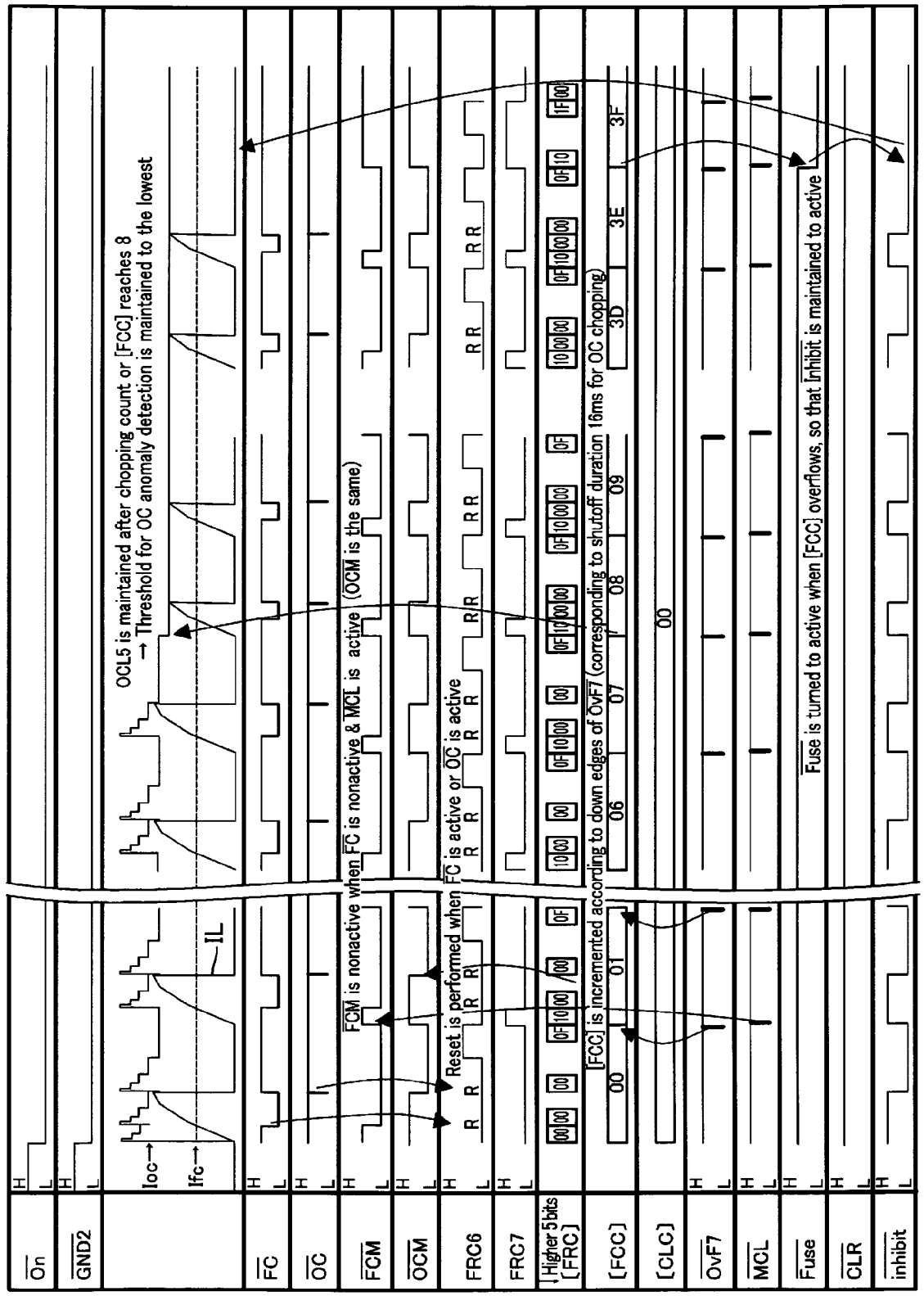
FIG. 19 is a timing chart of various signals for illustrating an operation of the power supply controller (during an overcurrent)
Figure 20:
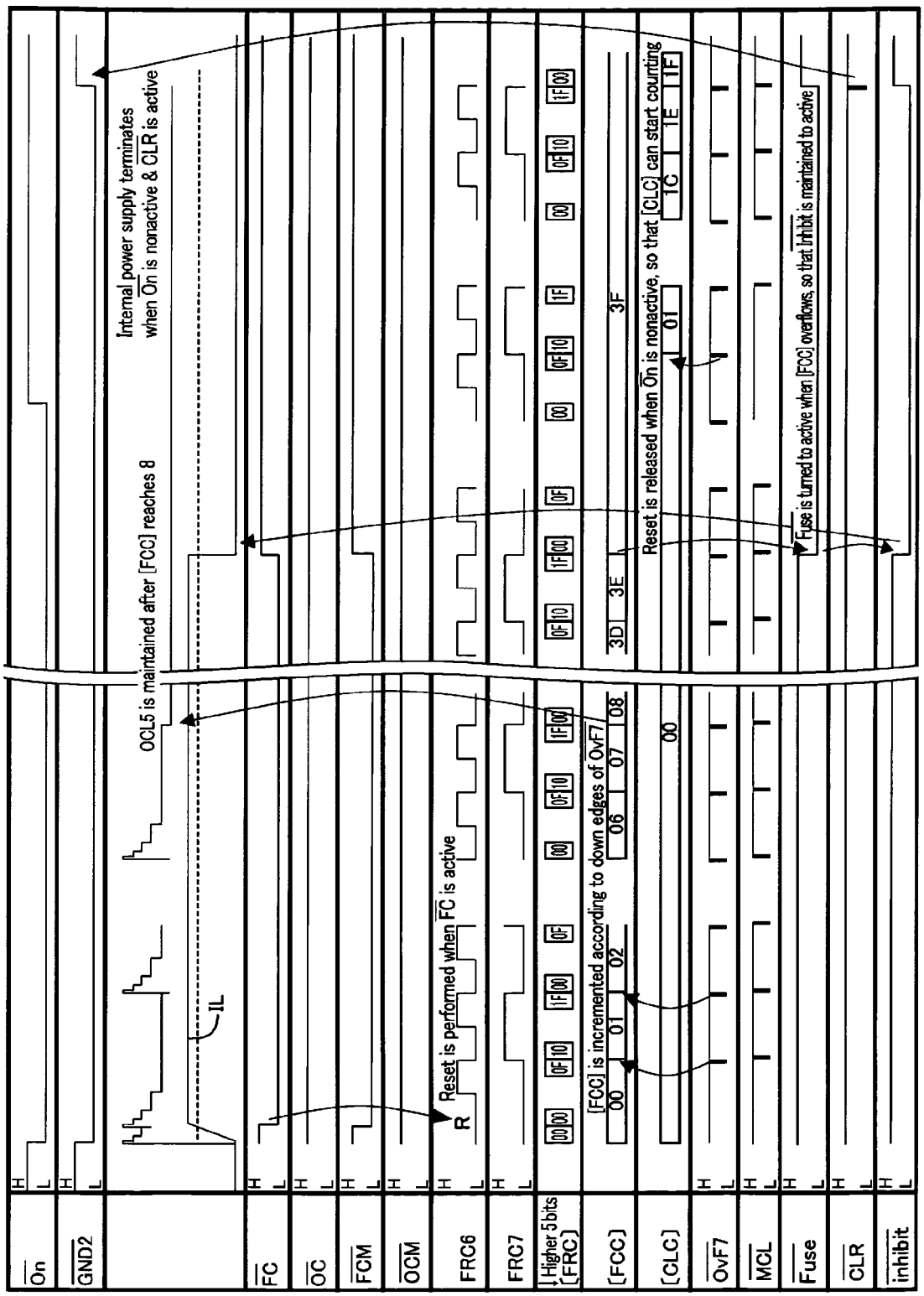
FIG. 20 is a timing chart of various signals for illustrating an operation of the power supply controller (during a fuse current).

FIGS. 18 to 20 are timing charts of various signals for illustrating the operation of the power supply controller 210. FIG. 18 relates to an operation during a normal state. FIG. 19 relates to an operation during an overcurrent occurrence. FIG. 20 relates to an operation during a fuse current occurrence. In the drawings, [FRC] represents the count value of the higher 5 bits of the FR counter 271. [FCC] represents the count value of the fuse counter 273. [CLC] represents the count value of the clear counter 272. The count values are shown in hexadecimal (e.g. A=10, B=11, C=12 and the like). Further, FRC7 represents the most significant bit of the FR counter 271, and how the most significant bit alternates between high and low levels is shown. FRC6 represents the second significant bit of the FR counter 271, and how the second significant bit alternates between high and low levels is shown. "R" in the drawings means "reset".

(Normal Operation)

When the power supply controller 210 receives an active control signal On, the internal ground generator 23 generates an internal ground GND2. When the internal ground GND2 stabilizes, the reset signal RST outputted from the reset signal generator 275 turns from active to nonactive, so that the reset states of the counters 71-73 are released.

The active control signal On is provided for the gate driver 28 via the control logic portion 227. Then the power MOSFET 14 and the like turn ON resulting in a conductive state. The FR counter 271 begins to count according to the clock signal CLK from the oscillator 274. During the normal operation, an active set signal OC1 is not outputted from the NAND circuit 280 (i.e., reset condition 2 is not satisfied), and the output signal FCM of the FC memory 278 is not level-inverted from high to low level (i.e., the reset condition 3 is not satisfied). Therefore the FR counter 271 repeatedly counts to 32 milliseconds without being reset in the middle of the count (See [FRC] in FIG. 18). At the same time, the OC threshold designation generator 93 sequentially outputs active threshold designation signals OCL0-OCL5 depending on the count value of the higher 5 bits of the FR counter 271. Thereby an operation, which decreases the first anomaly threshold current ILoc stepwise with time beginning with the initial level higher than an inrush current, is iterated in 32 millisecond periods.

When an active control signal On is inputted, an inrush current higher than the second anomaly threshold current ILfc may pass into the power MOSFET 14. However, the first anomaly threshold current ILoc is then set to the initial level higher than the inrush current, and thereby a first forcing shutoff operation due to the inrush current can be prevented from being performed for the power MOSFET 14 and the like.

During the normal operation, the anomaly notification signal Fail is nonactive, and therefore the fuse counter 273 does not start the count (See [FCC] in FIG. 18). On the other hand, the clear counter 272 increments its count value one by one at times of input of the count signal OvF7 from the FR counter 271. It is not reset in the middle of the count, since the anomaly notification signal Fail is maintained nonactive. When 512 milliseconds (i.e., the second reference time) are reached, the counter overflows and outputs an active clear signal CLR (See [CLC] and [CLR] in FIG. 18).

When the control signal On turns from active to nonactive, the internal ground generator 23 waits for overflow of the clear counter 272 as described above if the counter has not overflowed at the time. Then generation of the internal ground GND2 is terminated.

(Operation During Overcurrent or Fuse Current Occurrence)

If short-circuiting occurs in the load 11, the load current IL may exceed the second anomaly threshold current ILfc as shown in FIG. 19. At the time, the fuse current signal FC turns to active, so that the output signal FCM of the FC memory 278 is level-inverted from high to low level and the count value of the FR counter 271 is reset. Thereby the first anomaly threshold current ILoc is restored to the initial level, and thereafter is decreased stepwise again with time according to the count value of the FR counter 271 that starts the count after the reset.

When the load current IL thereafter exceeds the first anomaly threshold current ILoc, the overcurrent signal OC turns to active and the set signal OC1 from the NAND circuit 280 turns to active. Thereby the first forcing shutoff signal OCM from the OC memory 276 turns to active. Then a first forcing shutoff operation for the power MOSFET 14 is performed in response to an active forcing shutoff signal Inhibit. Further the count value of the FR counter 271 is reset in response to the active set signal OC1. Thereafter an active count signal OvF7 is outputted when a time slightly shorter than 16 milliseconds has elapsed. In response to this, the fuse counter 273 increments its count value by one (See [FCC] in FIG. 19). An active shutoff release signal MCL is outputted when the FR counter 271 has counted 16 milliseconds. Then the OC memory 276 outputs a nonactive first forcing shutoff signal OCM so that the power MOSFET 14 is returned to ON and the forcing shutoff state is released.

If the short-circuiting in the load 11 is thereafter not eliminated, the clear counter 272 will not start the count, and the first forcing shutoff is performed repeatedly. During that time, the fuse counter 273 increments its count value one by one. If the count value [FCC] reaches seven (i.e., if the first forcing shutoff has been performed seven times), the OC threshold designation generator 293 thereafter keeps outputting an active threshold designation signal OCL5 so that the first anomaly threshold current ILoc is maintained to the lowest level.

When the fuse counter 273 has overflowed, it outputs an active second forcing shutoff signal Fuse so that the forcing shutoff operation for the power MOSFET 14 is performed. At this time, the count operation according to the count signal OvF7 is discontinued, so that the forcing shutoff state (due to the second forcing shutoff) is maintained. Note that the second anomaly threshold current ILfc is set to a level slightly higher than the rated current ILmax of the load 11. The reference FUSE time is set to a time shorter than the time taken for the electric wire 30 to emit smoke when a fuse current, i.e., a current higher than the second anomaly threshold current ILfc, is intermittently detected at intervals shorter than the second reference time. Therefore, a chattering short, i.e., an abnormal current that occurs in a fraction of the stranded wires of the electric wire 30 at intervals shorter than the second reference time due to short-circuiting in the fraction of the stranded wires, can be detected without the electric wire 30 reaching smoke emission, so that the first forcing shutoff is performed for the power MOSFET 14.

Thereafter, if the control signal On turns from active to nonactive as shown in FIG. 20, the reset state of the clear counter 272 is released. The clear counter continues to output a nonactive clear signal CLR until its overflow, so that generation of the internal ground GND2 is maintained. When the clear counter has overflowed, generation of the internal ground GND2 is terminated. Therefore, the second forcing shutoff state is maintained, even if the control signal On returns to active before the clear counter 272 overflows.

(Operation During Wire-Breaking Anomaly Occurrence)

If the third anomaly threshold current ILop is supposedly set to a fixed value, a load resistance value (i.e., a resistance value of the external circuit), based on which an active breaking indication signal OP is outputted, varies with variation of the power supply voltage Vcc. However, a wire-breaking anomaly should be determined consistently based on the same load resistance value regardless of variation of the power supply voltage Vcc, in order to accurately detect the wire-breaking anomaly.

Therefore, in the present embodiment, the third anomaly threshold current ILop (and the third anomaly threshold voltage Vop) are set so as to vary in proportion to the source voltage Vs of (or the power supply voltage Vcc for) the power MOSFET 14 in the ON state as described above. According to this construction, the third anomaly threshold current ILop decreases by half, if the power supply voltage Vcc decreases by half, for example. That is, the load resistance value, based on which a wire-breaking anomaly is detected (and which is equal to a value determined by dividing the power supply voltage Vcc by the third anomaly threshold current ILop), is the same regardless of variation of the power supply voltage Vcc. Thereby, a wire-breaking anomaly can be detected accurately. Further, a microcomputer or the like is not required.

Other Embodiments

The present invention is not limited to the embodiments explained in the above description made with reference to the drawings. The following embodiments may be included in the technical scope of the present invention, for example.
- (1) In the above embodiments, the power MOSFET 14 is included as a semiconductor switching element. However the present invention is not limited to this construction, but a unipolar transistor other than the above or alternatively a bipolar transistor may be included as a semiconductor switching element.
- (2) In the above embodiments, the sense MOSFET 18 is used as a current detecting switching element. That is, current detection is performed by a sensing method. However the present invention is not limited to this construction, but the current detection may be performed by a shunt method. For example, a shunt resistor is provided on the power supply line, so that the load current can be detected based on the voltage drop thereon.
- (3) In the above embodiments, the start of current supply on the power supply line is detected based on whether the load current IL exceeds the second anomaly threshold current ILfc. However, what serves as a basis for detection of start of current supply is not limited to a current value in a current anomaly. What is required is that start of current supply on the power supply line can be detected. Therefore, the start of current supply may be determined if the load current exceeds a normal current level or a lower current level. That is, the normal current level or the lower current level may be used as a second threshold. According to this construction, the first threshold is set to a lower level after the inrush current has died down, and thereafter will not be restored to the initial level if a normal state continues for a second reference time. Further, the detection may be performed based on the ON resistance or the output-side potential (e.g., the source potential) of a semiconductor switching element (including another switching element provided on the downstream side, if any) provided on the power supply line, or based on whether an ON signal for turning ON the semiconductor switching element is inputted.
- (4) The threshold adjustment circuit may generate the first threshold based on the terminal voltage of an RC parallel circuit, for example, instead of using the counter circuit as in the above embodiments. The first threshold can be decreased with time by discharging the capacitor of the RC parallel circuit over time.
- (5) The fuse time counter 73 counts the time only in an anomaly state. However, the time may be accumulated including a normal-state time.
- (6) In the above embodiment, the number counter circuit 88 counts the number of times the load current IL exceeds the second anomaly threshold current ILfc, and the initialization operation is disabled when the number of times reaches y. However, the present invention is not limited to this construction. The number of outputs of a low-level output signal S5 from the shutoff duration counter 71, i.e., the number of times the first forcing shutoff operation is performed, may be counted. If the number reaches x, the subsequent initialization operation should be disabled.
- (7) In the above embodiments, the first anomaly threshold current ILoc is decreased stepwise according to the accumulated time of the fuse time counter 73 used for a fuse function. However, the present invention is not limited to this construction. That may be decreased stepwise according to the accumulated time of a time counter other than the fuse time counter 73.

The invention claimed is:

1. A threshold adjustment method for a power supply controller having an overcurrent protective function provided for performing a first shutoff operation for a semiconductor switching element, disposed on a power supply line from a power source to a load, for a first reference time if a load current passing through said semiconductor switching element exceeds a first threshold, and thereafter restoring said semiconductor switching element to a conductive state, said threshold adjustment method for the power supply controller comprising:

decreasing a level of said first threshold with time if a current supply detection signal is outputted from a current supply detecting circuit configured to detect current supply on said power supply line; and performing an initialization operation at most a predetermined number of times, the initialization operation restoring said first threshold to an initial level if said first shutoff operation for said semiconductor switching element is performed due to said overcurrent protective function being performed, and after the level of the first threshold is decreased, determining if the load current passing through the semiconductor switching element exceeds a decreased value of the first threshold.

2. A power supply controller for controlling power supply from a power source to a load, comprising:

a semiconductor switching element disposed on a'power supply line from said power source to said load;

a current detecting element configured to detect a load current passing through said semiconductor switching element;

a first abnormal current detecting circuit configured to determine based on a current detection signal from said current detecting element whether or not a load current passing through said semiconductor switching element exceeds a first threshold, and further configured to output a first abnormal current signal if said load current exceeds said first threshold;

an overcurrent protective circuit configured to perform a first shutoff operation for said semiconductor switching element for a first reference time if said first abnormal current signal is outputted from said first abnormal current detecting circuit, and thereafter restore said semiconductor switching element to a conductive state;

a current supply detecting circuit configured to detect current supply on said power supply line;

a threshold adjustment circuit configured to decrease a level of said first threshold if a current supply detection signal is outputted from said current supply detecting circuit; and a threshold initialization circuit configured to perform an initialization operation at most a predetermined number of times, the initialization operation restoring said first threshold to an initial level if said overcurrent protective circuit performs said first shutoff operation for said semiconductor switching element after said current supply detection signal is outputted from said current supply detecting circuit, wherein after the level of the first threshold is decreased, the first abnormal current detecting circuit is configured to determine whether or not the load current passing through the semiconductor switching element exceeds a decreased level of the first threshold.

3. A power supply controller for controlling power supply from a power source to a load, comprising:

a semiconductor switching element disposed on a power supply line from said power source to said load;

a current detecting element configured to detect a load current passing through said semiconductor switching element;

a first abnormal current detecting circuit configured to determine based on a current detection signal from said current detecting element whether or not a load current passing through said semiconductor switching element exceeds a first threshold, and further configured to output a first abnormal current signal if said load current exceeds said first threshold;

an overcurrent protective circuit configured to perform a first shutoff operation for said semiconductor switching element for a first reference time if said first abnormal current signal is outputted from said first abnormal current detecting circuit, and thereafter restore said semiconductor switching element to a conductive state;

a current supply detecting circuit configured to detect current supply on said power supply line; and a threshold adjustment circuit configured to decrease a level of said first threshold if a current supply detection signal is outputted from said current supply detecting circuit, wherein said current supply detecting circuit is configured to determine based on a current detection signal from said current detecting element whether or not a load current passing through said semiconductor switching element exceeds a second threshold lower than said first threshold, and further configured to output said current supply detection signal if said load current exceeds said second threshold, wherein after the level of the first threshold is decreased, the first abnormal current detecting circuit is configured to determine whether or not the load current passing through the semiconductor switching element exceeds a decreased level of the first threshold.

4. A power supply controller for controlling power supply from a power source to a load, comprising:

a semiconductor switching element disposed on a power supply line from said power source to said load;

a current detecting element configured to detect a load current passing through said semiconductor switching element;

a first abnormal current detecting circuit configured to determine based on a current detection signal from said current detecting element whether or not a load current passing through said semiconductor switching element exceeds a first threshold, and further configured to output a first abnormal current signal if said load current exceeds said first threshold;

an overcurrent protective circuit configured to perform a first shutoff operation for said semiconductor switching element for a first reference time if said first abnormal current signal is outputted from said first abnormal current detecting circuit, and thereafter restore said semiconductor switching element to a conductive state;

a current supply detecting circuit configured to detect current supply on said power supply line;

a threshold adjustment circuit configured to decrease a level of said first threshold if a current supply detection signal is outputted from said current supply detecting circuit; wherein:

said current supply detecting circuit is a second abnormal current detecting circuit configured to determine based on a current detection signal from said current detecting element whether or not a load current passing through said semiconductor switching element exceeds a second threshold lower than said first threshold, and further configured to output a second abnormal current signal if said load current exceeds said second threshold, said power supply controller further comprising:

an anomaly time accumulator circuit configured to start an operation for accumulating an anomaly time, if a second abnormal current signal is outputted from said second abnormal current detecting circuit, said anomaly time being a time during which at least said second abnormal current signal is being continually outputted;

wherein said threshold adjustment circuit is configured to decrease a level of said first threshold according to an accumulated time of said anomaly time accumulator circuit, and after the level of the first threshold is decreased, the first abnormal current detecting circuit is configured to determine whether or not the load current passing through the semiconductor switching element exceeds a decreased level of the first threshold.

5. A power supply controller as in claim 4, further comprising a normal duration accumulator circuit configured to measure a normal duration, during which said load current is continuously maintained equal to or lower than a normal level lower than said second threshold, based on a current detection signal from said current detecting element after said anomaly time accumulator circuit starts the accumulation, and further configured to output a clear signal and clear said accumulated time of said anomaly time accumulator circuit when said normal duration reaches a second reference time.

6. A power supply controller as in claim 5, wherein said anomaly time accumulator circuit is configured to suspend the accumulation while said normal duration accumulator circuit measures a normal duration, and further configured to perform a second shutoff operation for said semiconductor switching element if said accumulated time reaches a third reference time.

7. A power supply controller as in claim 5, further comprising:

a free-running counter circuit configured to count to a predetermined time repeatedly, and output a count-up signal whenever count to said predetermined time is completed, wherein:

said anomaly time accumulator circuit includes a fuse counter circuit configured to increment its count value whenever said count-up signal is outputted from said free-running counter circuit if said second abnormal current signal is outputted from said second abnormal current detecting circuit, and further configured to perform a second shutoff operation for said semiconductor switching element when its count value reaches a reference anomaly count value; and said normal duration accumulator circuit includes a clear counter circuit and a normal duration reset circuit, said clear counter circuit being configured to increment its count value whenever said count-up signal is outputted from said free-running counter circuit, and further configured to output said clear signal when its count value reaches a reference clear count value, said normal duration reset circuit being configured to reset a count value of said clear counter circuit based on an output of said second abnormal current signal from said second abnormal current detecting circuit.

8. A power supply controller as in claim 7, wherein said overcurrent protective circuit is configured to release a state of said semiconductor switching element under said first shutoff when said free-running counter circuit completes count to a first reference time.

9. A power supply controller as in claim 2, further comprising a number reset circuit configured to reset a number of times said initialization operation has been performed by the threshold initialization circuit, if a second reference time has elapsed without said current supply detection signal being outputted from said current supply detecting circuit.

10. A power supply controller as in claim 2, further comprising:
a time accumulator circuit configured to start an operation for accumulating a time during which a current supply detection signal is outputted, if said current supply detection signal is outputted from said current supply detecting circuit, wherein:
the threshold adjustment circuit is configured to decrease a level of said first threshold with time according to an accumulated time of said time accumulator circuit; and
said threshold initialization circuit is configured to restore said first threshold to an initial level by resetting said accumulated time to an initial time during said initialization operation unless a number of times said initialization operation has been performed reaches said predetermined number of times, and further configured to operate so that reset of said accumulated time to the initial time is prevented after a number of times said initialization operation has been performed reaches said predetermined number of times.

11. A power supply controller as in claim 10, wherein:
said current supply detecting circuit is a second abnormal current detecting circuit configured to determine based on a current detection signal from said current detecting element whether or not a load current passing through said semiconductor switching element exceeds a second threshold lower than said first threshold, and further configured to output a second abnormal current signal as said current supply detection signal if said load current exceeds said second threshold;
said time accumulator circuit is an anomaly time accumulator circuit configured to start an operation for accumulating an anomaly time, during which at least a second abnormal current signal is outputted, if said second abnormal current signal is outputted from the second abnormal current detecting circuit, and further configured to perform a second shutoff operation for said semiconductor switching element if an accumulated time reaches a third reference time; and
said threshold adjustment circuit includes a number counter circuit configured to count a number of outputs of said second abnormal current signal, said threshold adjustment circuit being configured to perform said initialization operation by resetting an accumulated time of said anomaly time accumulator circuit unless said count number reaches said predetermined number of times, and further configured to operate so that reset of said accumulated time is prevented and thereby said initialization operation is prevented when said count number reaches said predetermined number of times.

12. A power supply controller as in claim 11, further comprising a normal duration accumulator circuit configured to measure a normal duration, during which said load current is continuously maintained equal to or lower than a normal level lower than said second threshold, based on a current detection signal from said current detecting element, and further configured to output a clear signal, when said normal duration reaches a second reference time, so as to reset said accumulated time of said anomaly time accumulator circuit and a count number of said number counter circuit.

13. A power supply controller as in claim 11, further comprising a reset disabling circuit configured to disable reset of an accumulated time of said anomaly time accumulator circuit performed by said initialization operation, if said accumulated time reaches a reset enabling time shorter than said third reference time.

14. A power supply controller as in claim 2, wherein:
said current supply detecting circuit is a second abnormal current detecting circuit configured to determine based on a detection signal from said current detecting element whether a load current passing through said semiconductor switching element exceeds a second threshold lower than said first threshold, and further configured to output a second abnormal current signal as said current supply detection signal if said load current exceeds said second threshold, said power supply controller further comprising:
a free-running counter circuit configured to count to a predetermined time repeatedly, and output a count-up signal whenever count to said predetermined time is completed;
a free-running counter reset circuit configured to reset a count value of said free-running counter circuit when said second abnormal current signal is outputted from said second abnormal current detecting circuit;
a fuse counter circuit configured to increment its count value whenever said count-up signal is outputted from said free-running counter circuit if said second anomaly current signal is outputted, and further configured to perform a second shutoff operation for said semiconductor switching element when its count value reaches a reference anomaly count value corresponding to a third reference time;
a clear counter circuit configured to increment its count value whenever said count-up signal is outputted from said free-running counter circuit, and further configured to output a clear signal so as to reset a count value of said fuse counter circuit when its count value reaches a reference clear count value corresponding to a second reference time; and
a normal duration reset circuit configured to reset a count value of said clear counter circuit based on an output of said second abnormal current signal;
wherein, unless a count value of said fuse counter circuit reaches an initialization limit count value smaller than said reference anomaly count value, said threshold adjustment circuit decreases a level of said first threshold with time according to a count value of said free-running counter circuit, and said initialization operation is performed due to restoration of a count value of said free-running counter circuit to an initial value when count to said predetermined time is completed; and said initialization operation is prevented when a count value of said fuse counter circuit reaches said initialization limit count value.

15. A power supply controller as in claim 14, wherein said overcurrent protective circuit is configured to release a state of said semiconductor switching element under said first shutoff based on completion of count to said first reference time by said free-running counter circuit.

16. A power supply controller as in claim 2, wherein said semiconductor switching element is a power FET; said current detecting element is a sense FET through which a sense current having a predetermined relation to a load current passing through said power FET passes; said first abnormal current detecting circuit outputs said first abnormal current signal based on said sense current and said first threshold; and said second abnormal current detecting circuit outputs said second abnormal current signal based on said sense current and said second threshold.

17. A power supply controller as in claim 6, wherein said second reference time is set to a time longer than a shorting period of intermittent short-circuiting, which occurs in an external circuit connected to said semiconductor switching element resulting in smoke emission.

18. A power supply controller as in claim 5, further comprising:
a switch control circuit configured to receive alternating an ON signal and an OFF signal repeatedly, and further configured to turn said semiconductor switching element to a conductive state based on an input of said ON signal, and turn said semiconductor switching element to a shutoff state based on an input of said OFF signal;
wherein said second reference time is set to a time longer than a shutoff period during which said semiconductor switching element is maintained in a shutoff state due to each period of said OFF signal.

19. A power supply controller as in claim 3, wherein said second threshold is set to a level, which is higher than a rated current of said load and lower than a current that causes smoke emission from an external circuit connected to said semiconductor switching element.

20. A power supply controller as in claim 2, wherein each value of said first threshold being changed with time is set to a level lower than a smoke-emitting current, which causes smoke emission from an external circuit connected to said semiconductor switching element when application thereof continues for a time equal to an elapsed time corresponding to the value.

21. A power supply controller as in claim 2, wherein each value of said first threshold being changed with time is set to a level lower than a self-destructive current, which causes self-destruction of said semiconductor switching element when application thereof continues for a time equal to an elapsed time corresponding to the value.

* * * * *